(12) United States Patent
Kitsunai et al.

(10) Patent No.: US 8,653,455 B2
(45) Date of Patent: Feb. 18, 2014

(54) CHARGED PARTICLE BEAM DEVICE AND EVALUATION METHOD USING THE CHARGED PARTICLE BEAM DEVICE

(75) Inventors: Hiroyuki Kitsunai, Kasumigaura (JP); Seiichiro Kanno, Iwaki (JP); Masaru Matsushima, Hitachinaka (JP); Shuichi Nakagawa, Hitachinaka (JP); Go Miya, Hachioji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 143 days.

(21) Appl. No.: 13/375,085

(22) PCT Filed: Jun. 3, 2010

(86) PCT No.: PCT/JP2010/059421
§ 371 (c)(1),
(2), (4) Date: Nov. 29, 2011

(87) PCT Pub. No.: WO2010/140649
PCT Pub. Date: Dec. 9, 2010

(65) Prior Publication Data
US 2012/0070066 A1    Mar. 22, 2012

(30) Foreign Application Priority Data
Jun. 4, 2009    (JP) .................................. 2009-134962

(51) Int. Cl.
*G01N 23/00*    (2006.01)
(52) U.S. Cl.
USPC ............ 250/306; 250/307; 250/310; 250/311
(58) Field of Classification Search
USPC ................. 250/306, 307, 310, 311
See application file for complete search history.

(56) References Cited

U.S. PATENT DOCUMENTS

| | | | |
|---|---|---|---|
| 5,912,468 | A | 6/1999 | Hirano et al. |
| 6,903,338 | B2 | 6/2005 | Mankos et al. |

FOREIGN PATENT DOCUMENTS

| | | |
|---|---|---|
| JP | 6-104164 | 4/1994 |
| JP | 11-67885 | 3/1999 |
| JP | 11-167892 | 6/1999 |
| JP | 2001-257158 | 9/2001 |
| JP | 3251875 | 11/2001 |
| JP | 2003-142568 | 5/2003 |
| JP | 2004-235149 | 8/2004 |
| WO | 2009/157182 | 12/2009 |

OTHER PUBLICATIONS

International Search Report for PCT International Application No. PCT/JP2010/059421, mailed Jul. 13, 2010.

*Primary Examiner* — Michael Maskell
(74) *Attorney, Agent, or Firm* — Brundidge & Stanger, P.C.

(57) ABSTRACT

The charged particle beam device has a problem that a symmetry of equipotential distribution is disturbed near the outer edge of a specimen, an object being evaluated, causing a charged particle beam to deflect there. An electrode plate installed inside the specimen holding mechanism of electrostatic attraction type is formed of an inner and outer electrode plates arranged concentrically. The outer electrode plate is formed to have an outer diameter larger than that of the specimen. The dimensions of the electrode plates are determined so that an overlapping area of the outer electrode plate and the specimen is substantially equal to an area of the inner electrode plate. The inner electrode plate is impressed with a voltage of a positive polarity with respect to a reference voltage and of an arbitrary magnitude, and the outer electrode is impressed with a voltage of a negative polarity and of an arbitrary magnitude.

11 Claims, 15 Drawing Sheets

CHARGED PARTICLE BEAM DEVICE AND EVALUATION METHOD USING THE CHARGED PARTICLE BEAM DEVICE

TECHNICAL FIELD

The present invention relates to a device that scans a specimen (e.g., a wafer formed with semiconductor devices) with a charged particle beam and detects secondary electron signals or reflected electron signals from the specimen. More specifically, this invention relates to a dimension measuring device that measures dimensions of patterns formed on a specimen (hereinafter referred to as a "dimension measuring SEM") and to an inspection device that inspects the specimen for defects and foreign substances (hereinafter referred to as an "inspection SEM"). In this specification, a device used to measure and inspect patterns formed on a specimen by detecting signals that are produced from a charged particle beam is called a "charged particle beam evaluation device."

BACKGROUND ART

In a field of semiconductor device manufacturing system, devices that scan a semiconductor wafer with a charged particle beam to detect secondary electron signals or reflected electron signals from the semiconductor wafer are essential. As this kind of devices, there is a dimension measuring SEM that measures dimensions of patterns formed on the wafer, or an inspection SEM that checks for pattern defects, both by using signal waveforms representing the shapes of the patterns.

On the semiconductor wafer, the object to be measured and inspected, a plurality of rectangular chips having circuit patterns written thereon are formed in an substantially entire wafer surface. In semiconductor device fabricating workshops of recent years, there are growing calls for a capability to make circuit patterns on the wafer up to as near a wafer periphery as possible for efficient use of the surface area of the wafer, i.e., to obtain as many semiconductor chips from a single wafer as possible. For an increased number of semiconductor chips to be produced from one wafer, a move is already under way to expand the surface area of the wafer itself or increase its diameter.

However, since the dimension measuring SEMs are manufactured in conformity with the diameter of the wafer, if the wafer diameter is increased, a new SEM that matches the increased wafer diameter needs to be introduced, which constitutes a heavy burden in terms of facility investment. For improved return on investment in the dimension measuring SEM, it is desired that a dimension measuring SEM be made available that can deal with wafers of different diameters, such as 200 mm and 300 mm, at the same time. In other words, there is a growing need for a charged particle beam evaluation device capable of evaluating the wafer up to as close to its periphery and even wafers of different diameters.

When dimensions of a pattern formed on the wafer are measured using a charged particle beam or when an inspection is made to detect defects and foreign substances, if there are distortions in electric potential distributions in areas radiated with the charged particle beam, the charged particle beam deflects because of a gradient of electric potential. As a result, the charged particle beam strikes areas displaced from where it is supposed to hit to make measurements or inspections, making the inspection on the target areas impossible. This is generally called a position deviation. It also changes the angle of incidence of the charged particle beam, which in turn results in the pattern signal from the wafer (e.g., image) getting distorted.

This problem becomes prominent as the measuring position or inspection position comes close to the outer periphery of the wafer. This may be explained as follows. In central areas of the wafer, the electric potential distribution surrounding the position where the charged particle beam is radiated is considered symmetric with respect to the beam-applied position, whereas in peripheral areas of the wafer the potential distribution surrounding the beam-applied position is considered asymmetric with respect to the beam-struck position, causing the position deviation.

This problem becomes more serious as the wafer diameter increases. This is because the increased wafer diameter reduces the curvature of the outer circumference of the wafer, allowing device chips to be formed in areas up to near the outer edge of the wafer. This leads to a demand gaining momentum that the wafer be able to be inspected up to peripheral areas much closer to the outer edge of the wafer than ever.

However, as described earlier, the positional deviation of the charged particle beam becomes large as the area of interest gets closer to the outer edge. So, in a large-diameter wafer, areas where measurements and inspections cannot be made unavoidably remain near the outer edge.

Under these circumstances, efforts are being made to develop a technique that prevents distortions in the electric potential distribution near the periphery of the wafer and eliminates the positional deviations that would otherwise be caused by the deflection of the charged electron beam during measurement or inspection (see Patent Literatures 1 and 2).

CITATION LIST

Patent Literatures

Patent Literature 1: Japanese Patent No. 3251875
Patent Literature 2: JP-A-2004-235149

SUMMARY OF INVENTION

Technical Problem

Patent Literature 1, for example, discloses a technique that disposes a conductive material over the peripheral portion of a wafer and applies an electric potential to the conductive material to prevent distortions in electric potential distributions. This technique, though effective in correcting the potential distortions, poses a different problem that, since the peripheral portion of the wafer is covered over by the conductive material, there occur areas in the peripheral portion of the wafer where device chips cannot be formed. With this construction, parts necessarily protrude above the wafer, which gives rise to another problem of making it impossible to perform measurement or inspection on wafers of different diameters without changing the parts of the charged particle beam evaluation device.

Patent Literature 2, for example, discloses a technique that uses a wafer holder formed with a hole having an inner diameter larger than the wafer and a depth substantially equal to the wafer. This patent literature also describes that a gap, formed between the edge of the wafer and the hole in the wafer holder when the wafer is dropped into the hole, is closed with a conductive ring that is formed to have the same height as that of the wafer surface. That is, this arrangement prevents distortions in the electric potential distribution by assembling the wafer, the conductive ring and the wafer holder so that the height of their surfaces becomes substantially the same and by applying a voltage to the conductive ring. With the technique of Patent Literature 2, the potential distortions can be corrected and the areas in the peripheral portions of the wafer where device chips cannot be formed can be eliminated. This technique, however, has a drawback that the wafer cannot be measured or inspected without changing the wafer holder and the conductive ring according to the diameter of the wafer.

Under these circumstances, the inventors of this invention propose a technique that effectively minimizes deviations of evaluation positions caused by deflections of a charged electron beam even in areas close to the peripheral portions of the wafer, the object being evaluated.

Solution to Problem (1) According to one invention, the electrode plate installed inside the specimen holding mechanism of electrostatic attraction type is formed of two concentrically arranged electrode plates—a circular electrode plate and a ring-shaped electrode plate placed on the outer side of the circular electrode plate. The outer electrode plate has an outer diameter larger than that of a specimen. Further, these electrode plates are formed such that an overlapping area between the outer electrode plate and the specimen (i.e., a ring-shaped area enclosed between the inner diameter of the outer electrode plate and the outer diameter of the specimen) is substantially equal to an area of the inner electrode plate. The inner electrode plate is applied a voltage of a positive polarity with respect to the reference voltage and of a desired magnitude; and the outer electrode plate is applied a voltage of a negative polarity with respect to the reference voltage and of a desired magnitude. It is desired that the difference between the outer diameter of the outer electrode plate and the outer diameter of the specimen be 70% or more of a hole formed in the control electrode through which to pass charged particles.

(2) According to another invention, the electrode plate installed inside the specimen holding mechanism of electrostatic attraction type is formed of four concentrically arranged electrode plates. They are referred to, in order from inside to outside, as a circular first electrode plate and ring-shaped second, third and fourth electrode plates. To the first and third electrode plates a voltage of a positive polarity with respect to the reference voltage and of a desired magnitude is applied; and to the second and fourth electrodes a voltage of a negative polarity with respect to the reference voltage and of a desired magnitude is applied. The outer diameter of the second electrode plate is set larger than that of the smaller of two kinds of specimen to be evaluated. At this time, the second electrode plate is formed such that an overlapping area between the second electrode plate and the specimen (i.e., a ring-shaped area enclosed between the inner diameter of the second electrode plate and the outer diameter of the specimen) is substantially equal to an area of the first electrode plate. Further, the outer diameter of the fourth electrode plate is set larger than that of the larger of the two kinds of specimen. At this time, the fourth electrode plate is formed such that a sum of an overlapping area between the fourth electrode plate and the specimen (i.e., a ring-shaped area enclosed between the inner diameter of the fourth electrode plate and the outer diameter of the specimen) and an area of the second electrode plate is substantially equal to a sum of the area of the first electrode plate and an area of the third electrode plate. It is desired that the difference between the outer diameter of the second electrode plate and the outer diameter of the small-diameter specimen and the difference between the outer diameter of the fourth electrode plate and the outer diameter of the large-diameter specimen each be 70% or more of the hole formed in the control electrode through which to pass charged particles.

(3) According to still another invention, the electrode plate installed inside the specimen holding mechanism of electrostatic attraction type is formed of three concentrically arranged electrode plates. They are referred to, in order from inside to outside, as a first circular electrode plate and ring-shaped second and third electrode plates. At least the first electrode plate and the second electrode plate are impressed with a desired-magnitude voltage of a positive or negative polarity with respect to the reference voltage and a desired-magnitude voltage of a polarity opposite to the first one, respectively, according to the outer diameter of two kinds of specimen being evaluated. The third electrode plate is applied a desired-magnitude voltage of a negative polarity with respect to the reference voltage. In this invention, the outer diameter of the second electrode plate is set larger than that of the smaller of the two kinds of specimen. Further, the second electrode plate is formed such that an overlapping area of the second electrode plate and the specimen (i.e., a ring-shaped area enclosed between the inner diameter of the second electrode plate and the outer diameter of the specimen) is substantially equal to an area of the first electrode plate. The outer diameter of the third electrode plate is set larger than that of the larger of the two kinds of specimen. Further, the third electrode plate is formed such that a sum of an overlapping area of the third electrode plate and the specimen (i.e., a ring-shaped area enclosed between the inner diameter of the third electrode and the outer diameter of the specimen) and the area of the first electrode plate is substantially equal to an area of the second electrode plate. Furthermore, it is desired that the difference between the outer diameter of the second electrode plate and the outer diameter of the small-diameter specimen and the difference between the outer diameter of the third electrode plate and the outer diameter of the large-diameter specimen each be 70% or more of the radius of the hole formed in the control electrode through which to pass charged particles.

Advantageous Effects of the Invention

With one invention, a charged particle beam evaluation device can be realized that can evaluate a specimen up to a region close to its edge with high accuracy without having to use dedicated components. When a specimen of different size from a previous one is placed on the electrode for evaluation, another invention can implement a charged particle beam evaluation device that can evaluate the specimen up to a region close to its edge with precision without replacing components. Other objects, features and advantages of the invention will become apparent from the following description of embodiments taken in conjunction with the accompanying drawings.

DESCRIPTION OF EMBODIMENTS

Figure 1:
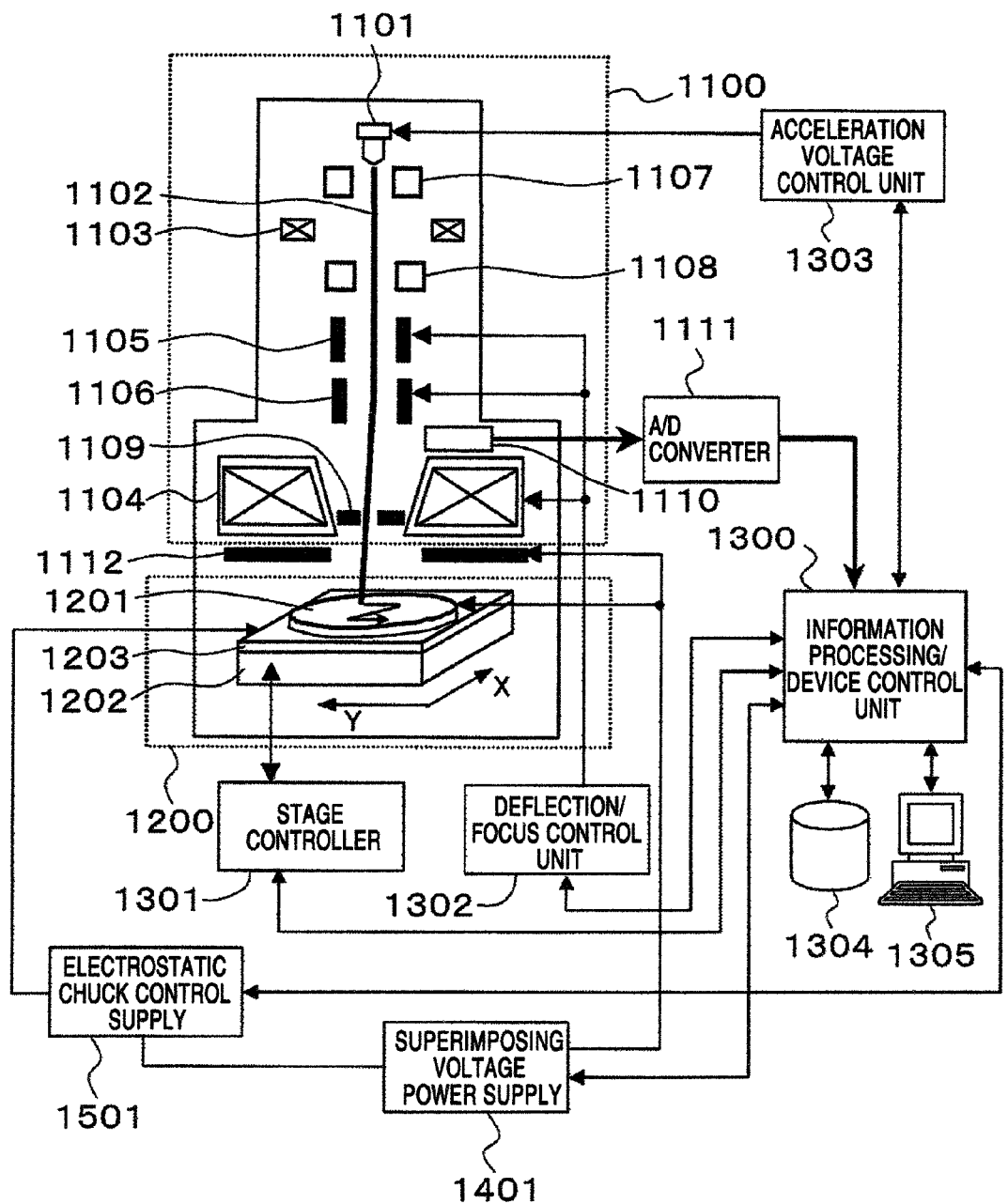
FIG. 1 A schematic diagram showing a configuration of a dimension measuring SEM according to one example embodiment.

Now, embodiments of a charged particle beam evaluation device according to the present invention will be described by referring to the accompanying drawings. While this invention is applicable to a variety of evaluation devices (e.g., dimension measuring devices and inspection devices) using a charged particle beam, the following description concerns example cases where the invention is applied to a dimension measuring SEM. While a secondary electron image will be described in the following example, a reflected electron image may also be used. It is also noted that the following description and drawings are intended solely for the explanation of this invention and may be combined or replaced with known techniques that are not described here.

(1) Embodiment 1

(1-1) Device Configuration

Dimension measuring SEMs using a scanning electron microscope (SEM) are essential equipment in managing dimensions of patterns in a semiconductor device fabrication process, as described earlier. The dimension measuring SEM comprises an electro-optical system 1100, a vacuum chamber 1200 having a stage drive system, a wafer transport system (not shown), a vacuum exhaust system (not shown) and an information processing/device control unit 1300.

The electro-optical system 1100 comprises an electron gun 1101, an alignment coil 1107 to align an emission of a primary electron beam 1102 from the electron gun 1101, a condenser lens 1103 to focus the primary electron beam 1102, an astigmatism correction coil 1108 to correct an astigmatism of the primary electron beam 1102, deflectors 1105, 1106 to deflect the primary electron beam 1102 two-dimensionally, an objective lens 1104 and an objective lens iris 1109.

A semiconductor substrate specimen 1201 such as a wafer (hereinafter referred to as a wafer) is placed on a specimen holder (hereinafter referred to as a "specimen mount" or an "electrostatic chuck") 1203 on an XY stage 1202 and made to travel in XY directions by a command from a stage controller 1301 and stop at an arbitrary position. A secondary electron detector 1110 detects secondary electrons produced by the primary electron beam striking the wafer 1201 and converts them into an electric signal to produce a secondary electron image (SEM image). The wafer 1201 is impressed with a negative superimposing voltage (also referred to as a "reference voltage") by a superimposing voltage power supply 1401. In a space between the wafer 1201 and the objective lens 1104 is installed a control electrode 1112 covering a wafer moving range and impressed with the same voltage as the superimposing voltage applied to the wafer 1201.

(1-2) Overview of Dimension Measuring Operation

The primary electron beam 1102 emitted from the electron gun 1101 is focused by the condenser lens 1103 and the objective lens 1109 and thrown as a minute spot on the wafer 1201. When it strikes against the wafer, the electron beam produces secondary electrons or reflected electrons from where it struck, according to the material and shape of the specimen. The deflectors 1105, 1106 are used to scan the primary electron beam 1102 two-dimensionally and the resulting secondary electrons are detected by the secondary electron detector 1110. The secondary electron detector 1110 converts the detected secondary electrons into an electric signal for output to an A/D (analog-to-digital) converter 1111. The A/D converter 1111 then converts the received electric signal into a digital signal. Now, a two-dimensional digital image or SEM image is acquired.

The wafer 1201 is applied a negative superimposing voltage from the superimposing voltage power supply 1401. Therefore, an acceleration voltage of the primary electron beam at the final stage of radiation onto the wafer 1201 is the superimposing voltage subtracted from the acceleration voltage emitted from the electron gun. Since the electron beam as it passes through the electro-optical system 1100 has high energy, a high resolution can be obtained. On the other hand, the primary electrons impinging on the wafer are decelerated and have low energy, preventing the wafer 1201 from being charged up. Potential variations in the wafer 1201 can be minimized by arranging the control electrode 1112 impressed with the superimposing voltage of the same potential as the wafer so that it faces the wafer 1201.

The information processing/device control unit 1300 controls the stage controller 1301, a deflection/focus control unit 1302, an acceleration voltage control unit 1303, a superimposing voltage power supply 1401 and an electrostatic chuck control supply 1501, individually.

The stage controller 1301 controls the XY stage 1202 in response to a command from the information processing/device control unit 1300. The deflection/focus control unit 1302 controls the deflectors 1105, 1106 according to a command from the information processing/device control unit 1300 to perform image magnification setting and focus control.

The acceleration voltage control unit 1303 controls the acceleration voltage according to a command from the information processing/device control unit 1300. The superimposing voltage power supply 1401 controls the superimposing voltage based on a command from the information processing/device control unit 1300.

The information processing/device control unit 1300 has a database 1304 to store the acquired images and measured data and a computer 1305 to display the result.

The information processing/device control unit 1300 of this embodiment has a processing unit to calculate a distance of the evaluation position from the wafer periphery and a correction table that stores optimum correction voltage values for combinations of the distance and a primary electron beam emission condition. The correction table may be stored in the database 1304. Based on the combination of the distance from the periphery of the wafer being evaluated, the primary electron beam emitting condition and, if necessary, the kind of wafer, the information processing/device control unit 1300 controls the value and polarity of the voltage to be applied to the electrode plate making up the electrostatic chuck so that the deflection of the primary electron beam radiated against the wafer will be zero. The correction table and the function of controlling the value and polarity of the voltage applied to the electrode plate will be described later.

(1-3) Construction of Electrostatic Chuck (Conventional Construction)

Figure 2:
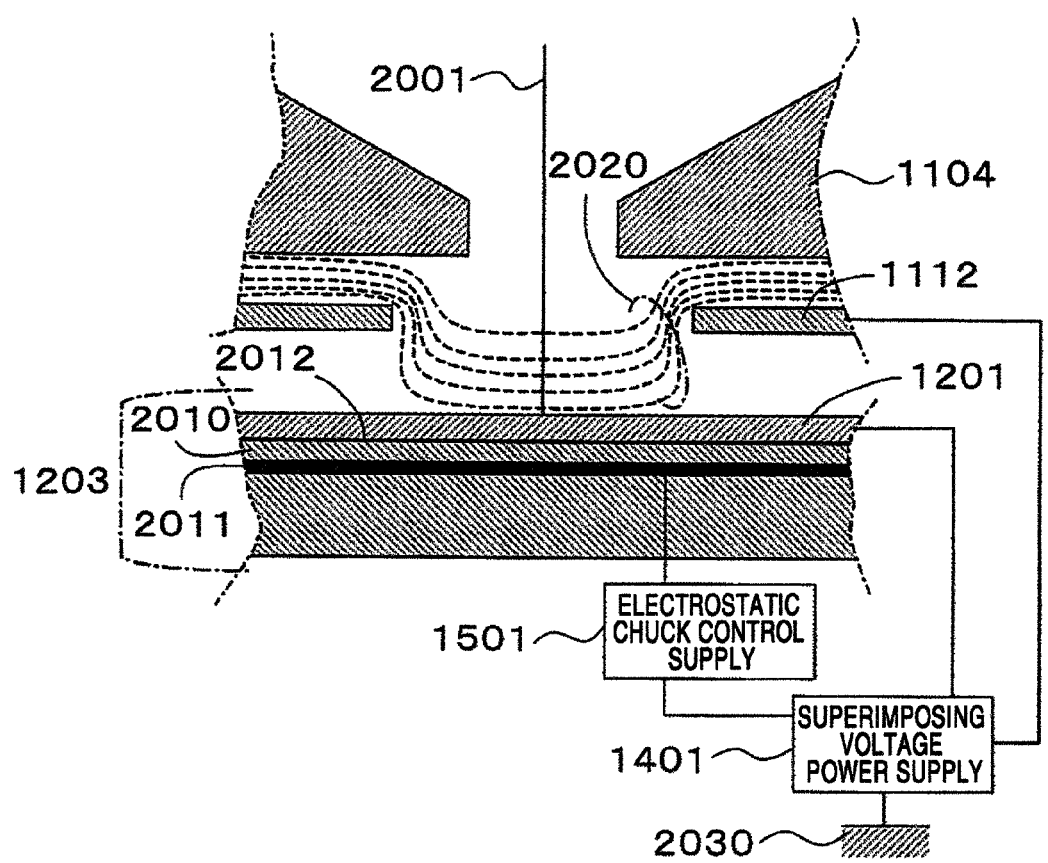
FIG. 2 A diagram showing an electric potential distribution when a central part of a wafer is measured.
Figure 3:
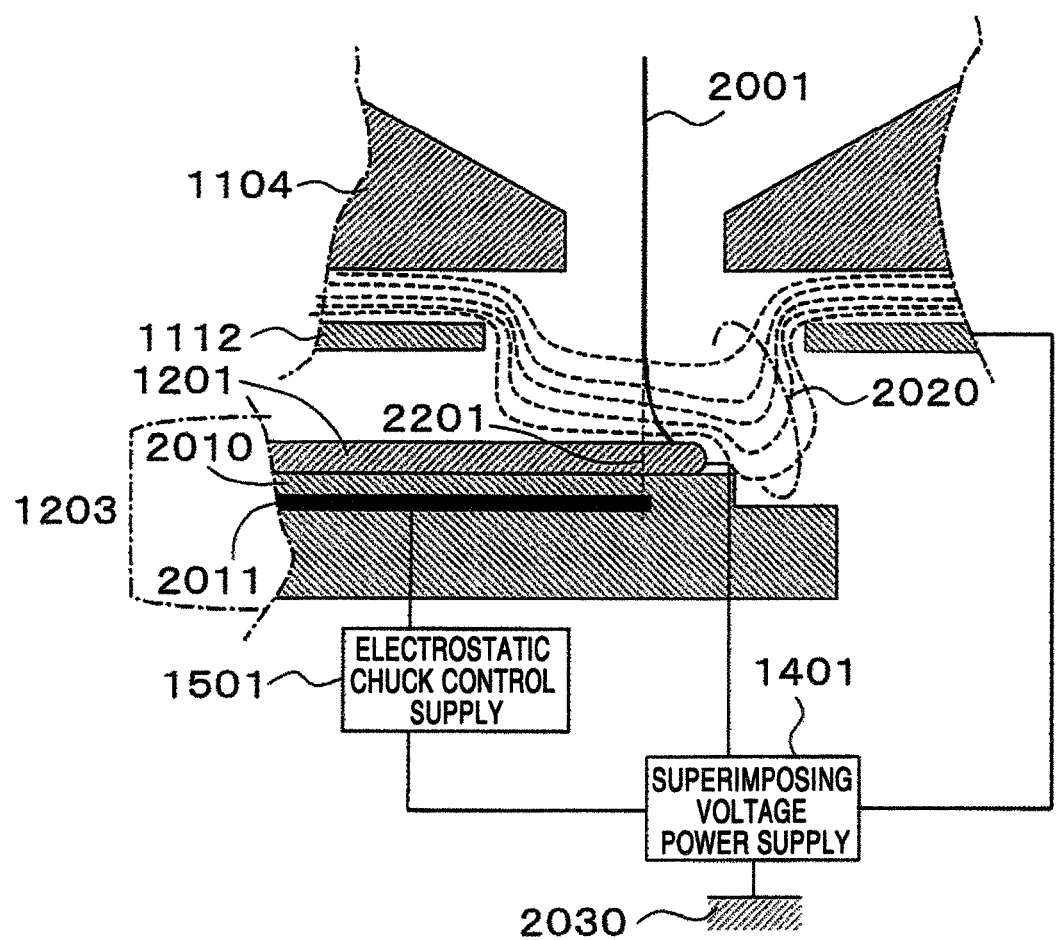
FIG. 3 A diagram showing an electric potential distribution when a peripheral portion of the wafer is measured (conventional technique).

FIG. 2 and FIG. 3 show an outline construction of the conventional electrostatic chuck. FIG. 2 shows a cross section of a wafer and associated components when a central part of the wafer 1201 is evaluated. FIG. 3 shows a cross section of a wafer and its surrounding when a peripheral part of the wafer is evaluated. The specimen mount 1203 used in this example is a specimen holder of electrostatic attraction type which comprises a ceramic dielectric 2010 and an electrode plate 2011 incorporated in the dielectric.

The electrostatic chuck holds the wafer 1201 to a dielectric surface 2012 by electrostatic attraction that is produced by a potential difference generated between the wafer 1201 and the electrode plate 2011 in the dielectric. As described earlier, the wafer 1201 is impressed with a negative superimposing voltage. So, the electrode plate 2011 of the electrostatic chuck is applied a voltage for attraction with the superimposing voltage as a reference potential. The electrode plate 2011 is a few μm to a few hundred μm thick (above the electrode plate).

As shown in FIG. 2, when the evaluation position is at a central region of the wafer, components surrounding a trajectory 2001 of the primary electron beam (objective lenses 1104, control electrode 1112, wafer 1201, specimen mount 1203, etc.) are symmetric in arrangement and geometry with respect to the beam trajectory. So, the electric potential distribution formed in the space surrounding the primary electron beam is also symmetric, producing no deflection of the beam. In the figure, dashed lines represent equipotential planes 2020 formed in the vicinity of the area that the primary electron beam strikes.

On the other hand, when the evaluation position is close to outer periphery of the wafer, as shown in FIG. 3, the shapes of the wafer 1201 and the specimen mount 1203 are asymmetric with respect to the primary electron beam trajectory, resulting in the equipotential planes 2020 sagging toward the outer periphery of the wafer, i.e., changing asymmetrically. This sagging of the equipotential planes causes the trajectory 2001 of the primary electron beam to deflect from a trajectory 2201 that it is supposed to follow toward the outside (or toward the outer periphery of the wafer 1201 when viewed from its center). As a result, the primary electron beam 1102 lands at a location apart from the intended evaluation position. This positional deviation of the trajectory 2001 of the primary electron beam becomes large as it approaches the outer periphery of the wafer, leading to a possible formation of areas where evaluations cannot be performed.

(Construction of the Embodiment)

On the other hand, the dimension measuring SEM of this embodiment optimizes the structure of the electrostatic chuck, the structure of the electrode plate installed in the electrostatic chuck, the size and polarity of an applied voltage, and the positional relation between the wafer and the control electrode that is controlled at the same potential as the wafer, in order to prevent the deflection of the trajectory of the primary electron beam.

Figure 4:
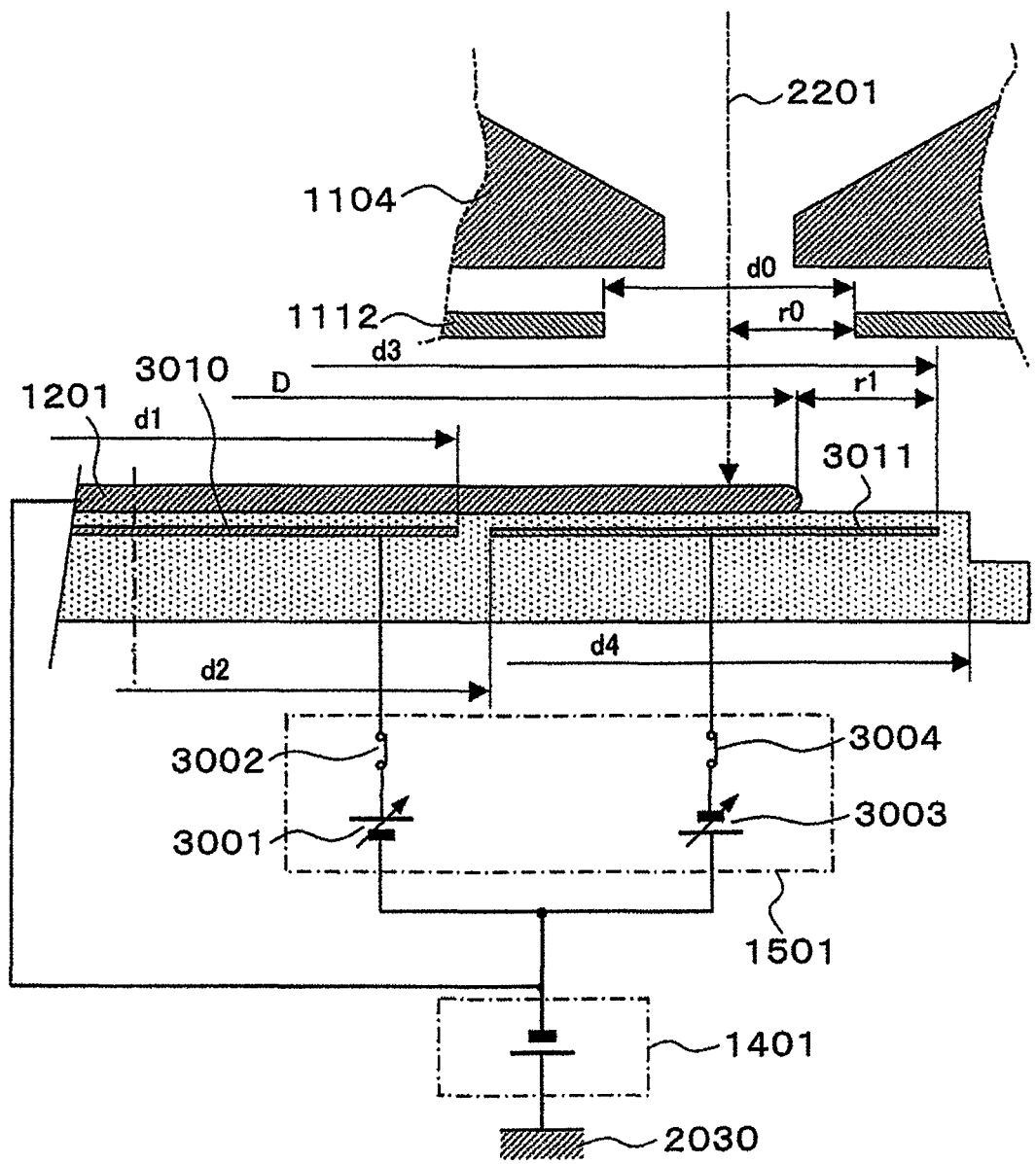
FIG. 4 A cross-sectional view showing how a wafer is placed in a first embodiment.
Figure 5:
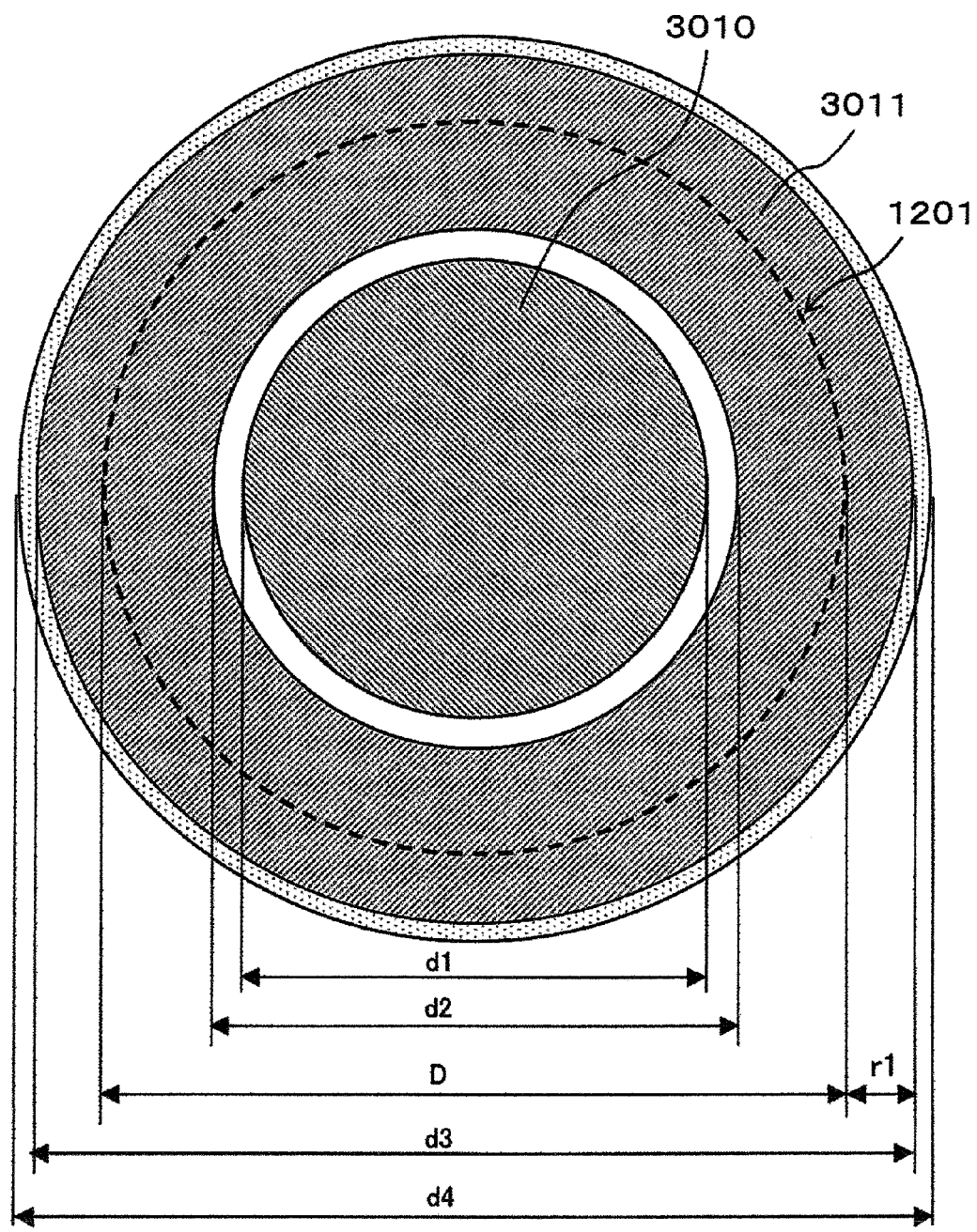
FIG. 5 A plan view showing a positional relation between an electrode plate structure used in the first embodiment and the wafer.
Figure 6:
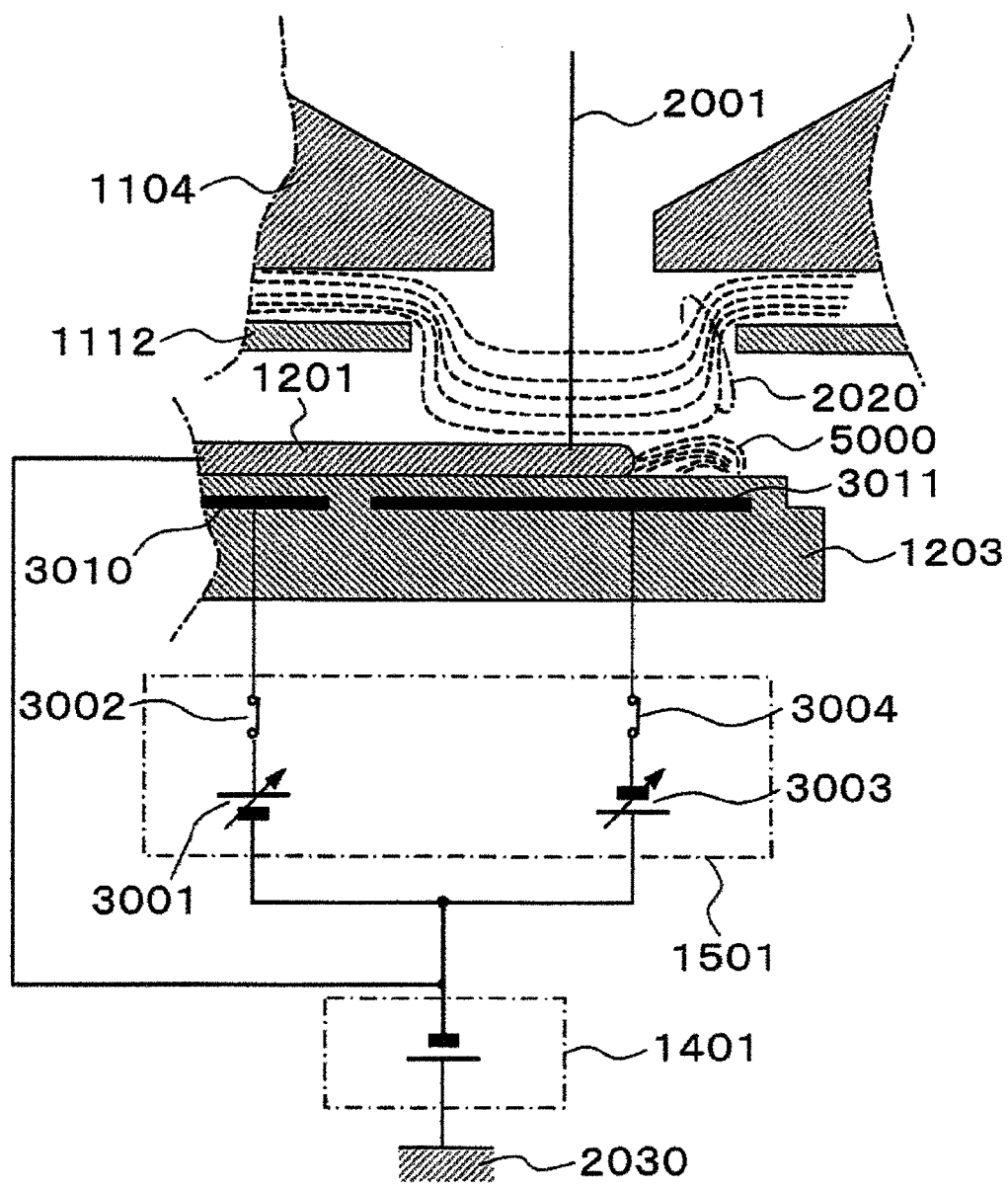
FIG. 6 A cross-sectional view showing an electric potential distribution formed in the first embodiment.

FIG. 4 to FIG. 6 show a positional relation between the electrostatic chuck used in the dimension measuring SEM of Embodiment 1 and the surrounding components, and also a relation between electrode plates and voltages applied to them. FIG. 4 is a cross section when the wafer 1201 is placed on the specimen mount 1203. FIG. 4 shows the positional relation among the wafer 1201, the electrostatic chuck 1203, the electrode plates 3010, 3011 in the electrostatic chuck, the objective lens 1104 and the control electrode 1112. FIG. 4 shows the wafer when the evaluation position is near its outer periphery. FIG. 5 is a plan view of the electrostatic chuck of FIG. 4 as seen from above.

As shown in FIG. 4 and FIG. 5, the electrostatic chuck 1203 in this embodiment is of bipolar type which has two concentric electrode plates 3010, 3011. These two electrode plates 3010, 3011 are connected to DC supplies 3001, 3003 through switches 3002, 3004, respectively. By turning on (or closing) these switches predetermined voltages can be applied to the electrode plates to attract the wafer 1201 to the electrostatic chuck. As already explained, the wafer 1201 is impressed with a negative superimposing voltage (−V0) from the superimposing voltage power supply 1401. So, the electrostatic chuck is impressed with a positive voltage (+V) and a negative voltage (−V) with the superimposing voltage taken as a reference voltage (−V0). At this time, the potential of the wafer 1201 is intermediate between the voltages applied to the electrode plates. The potential of the wafer 1201 therefore matches the superimposing voltage (−V0). In the explanation that follows, the positive voltage with respect to the reference voltage (−V0) is referred to simply as a "positive voltage" and the negative voltage with respect to the reference voltage (−V0) simply as a "negative voltage".

In this embodiment, the wafer 1201, the electrode plates 3010, 3011 in the electrostatic chuck and the control electrode 1112 are set in the following positional relationship. It is assumed that the dimensions of the wafer 1201 to be evaluated are known in advance and that the wafer 1201 is put at a predetermined position on the electrostatic chuck 1203 by the centering technique. This also applies to other embodiments.

In this embodiment, the two electrode plates 3010, 3011 making up the electrostatic chuck 1203 are disposed concentrically, as shown in FIG. 5. That is, on the central side is put the circular electrode plate 3010 (referred to as an "inner electrode plate"), on the outer side of which the ring-shaped electrode plate 3011 (referred to as an "outer electrode plate") is set.

The inner electrode plate 3010 is applied a positive voltage (+V) and the outer electrode plate 3011 a negative voltage (−V).

An outer diameter d3 of the outer electrode plate 3011 extends outwardly from the outer diameter D of the wafer by an overreaching dimension r1. The outer diameter d3 of the outer electrode plate 3011 is determined so that a ratio of the overreaching dimension r1 (=(d3−D)/2) to a radius of a hole r0 (=d0/2; d0=hole diameter) at the center of the control electrode 1112, R (=r1/r0), is 0.7 or greater (≥0.7). For example, the ratio R may be 0.75, 0.80, 0.85, 0.90, 0.95, 1.00, 1.05, . . . .

Further, the dimensions of the inner electrode plate 3010 and the outer electrode plate 3011 are set so that the area of the inner electrode plate 3010 (area of a circle of the diameter d1) is equal to a ring-shaped area of the outer electrode plate 3011 defined by the inner diameter d2 of the outer electrode plate and the outer diameter D of the wafer 1201. That is, the dimensions are determined so as to satisfy the following equation.

$$\pi \times (d1/2)^2 = \pi \times \{(D/2)^2 - (d2/2)^2\}$$

This means that the areas through which the inner electrode plate 3010 and the outer electrode plate 3011 apply their attraction forces to the wafer are effectively equal. This condition is also essential in controlling the potential to be applied to the wafer 1201 at an intermediary voltage (i.e., reference voltage (−V0)), with the inner electrode plate 3010 impressed with a positive voltage (+V) and the outer electrode plate 3011 with a negative voltage (−V).

FIG. 6 shows a trajectory of the primary electron beam 2001 when the aforementioned condition is met. As shown in FIG. 6, the two electrode plates 3010, 3011 making up the electrostatic chuck 1203 are arranged concentrically. The outer electrode plate 3011 is so arranged that its outer edge extends outwardly from the outer edge of the wafer 1201. The outer electrode plate is impressed with a voltage lower than the voltage applied to the wafer 1201 (i.e., −V). As a result, that portion of the outer electrode plate 3011 which extends outwardly from the outer edge of the wafer 1201 has a negative electric field 5000 formed on its surface. This negative field 5000 acts to push up the sagging equipotential planes 2020 that were observed in FIG. 3 at the peripheral portion of the wafer. That is, the deflection of the primary electron beam can be prevented by voltages applied for the operation of the electrostatic chuck.

Examinations of experiments and calculations conducted by the inventors of this invention have found that the greater the overreaching dimension r1 of the outer electrode plate 3011, the stronger the electric field that pushes up the sagging equipotential planes 2020 at around the outer periphery of the wafer. This effectiveness is found to be substantially saturated when the dimensions and arrangement are such that the ratio, R (=r1/r0), of the overreaching dimension r1 to the radius r0 of the hole (or opening) at the center of the control electrode 1112 is 0.7.

The effectiveness of pushing up the sagging equipotential planes becomes large as the electric field 5000 generated over the overreaching portion of the electrode increases, i.e., as the voltage applied to the electrostatic chuck increases. As already explained, the closer it gets to the outer periphery of the wafer, the more likely the primary electron beam is to deflect. So, the provision to the information processing/device control unit 1300 of a function to control the voltage applied to the electrostatic chuck according to the distance of the evaluation position from the outer edge of the wafer can more effectively prevent the deflection of the primary electron beam.

(1-4) Sequence of Steps

Figure 7:
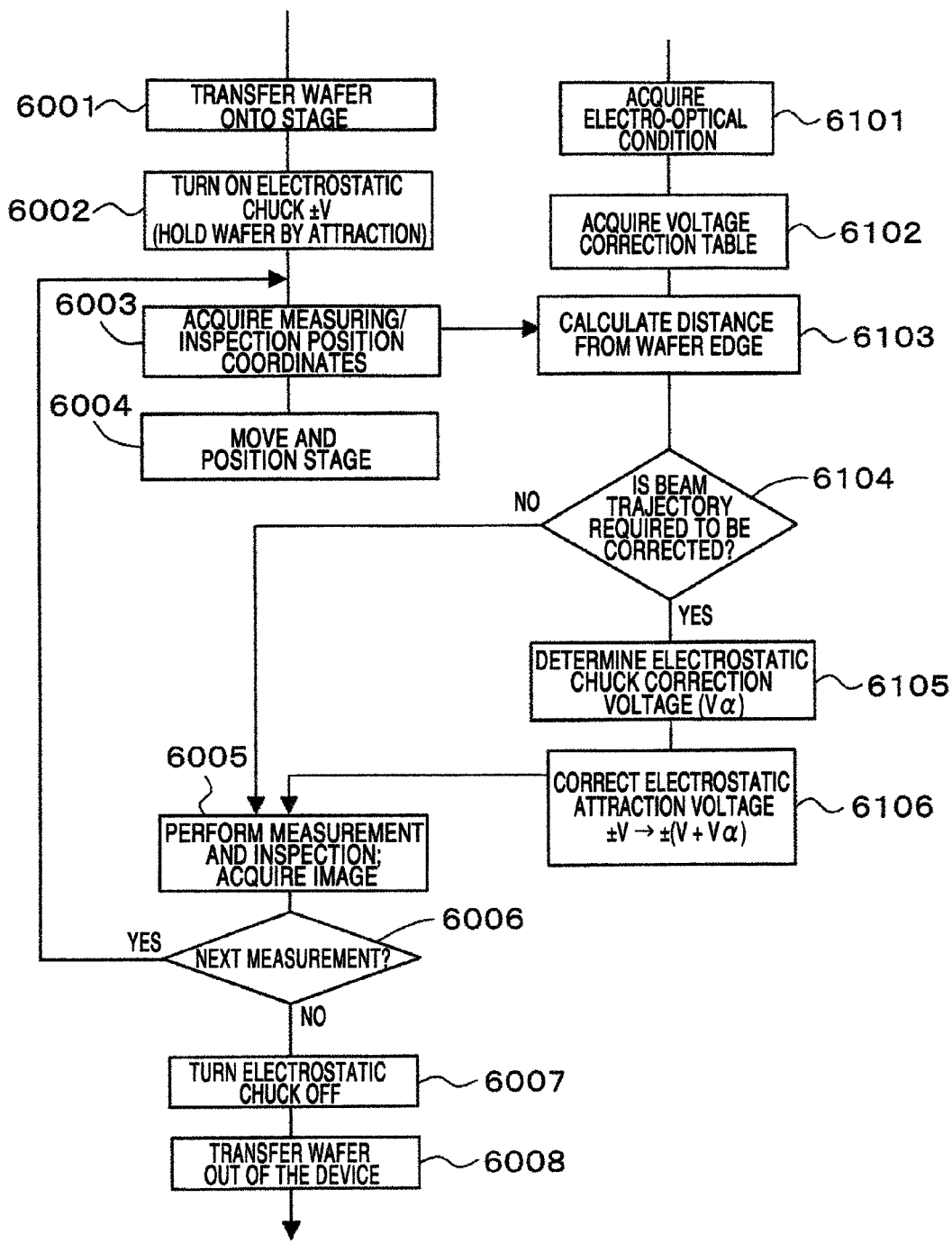
FIG. 7 A flow diagram showing a sequence of steps in the first embodiment.
Figure 8:
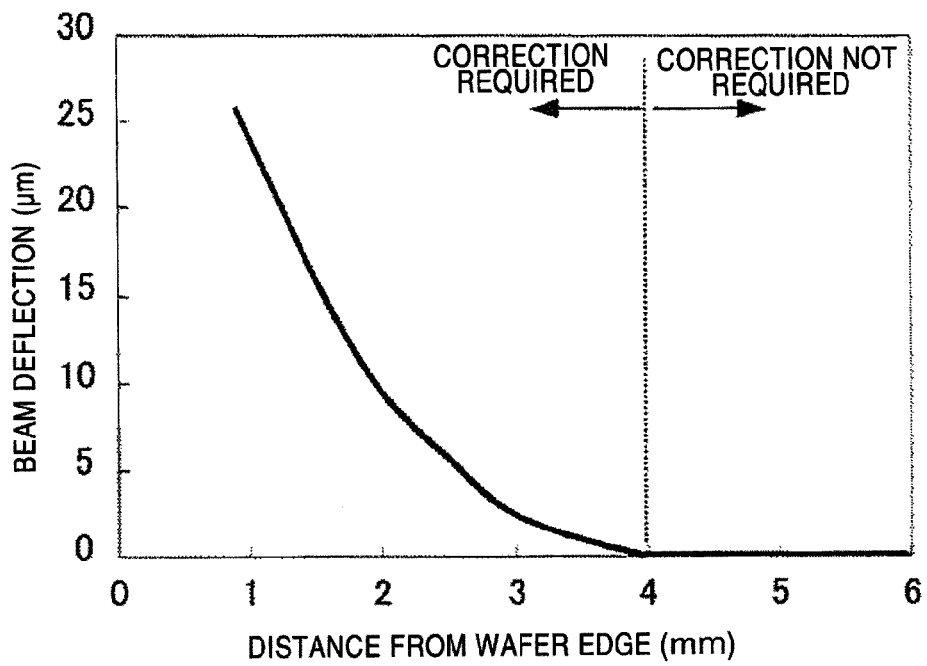
FIG. 8 A graph showing a relation between a distance from the outer periphery of the wafer and an amount of deflection.
Figure 9:
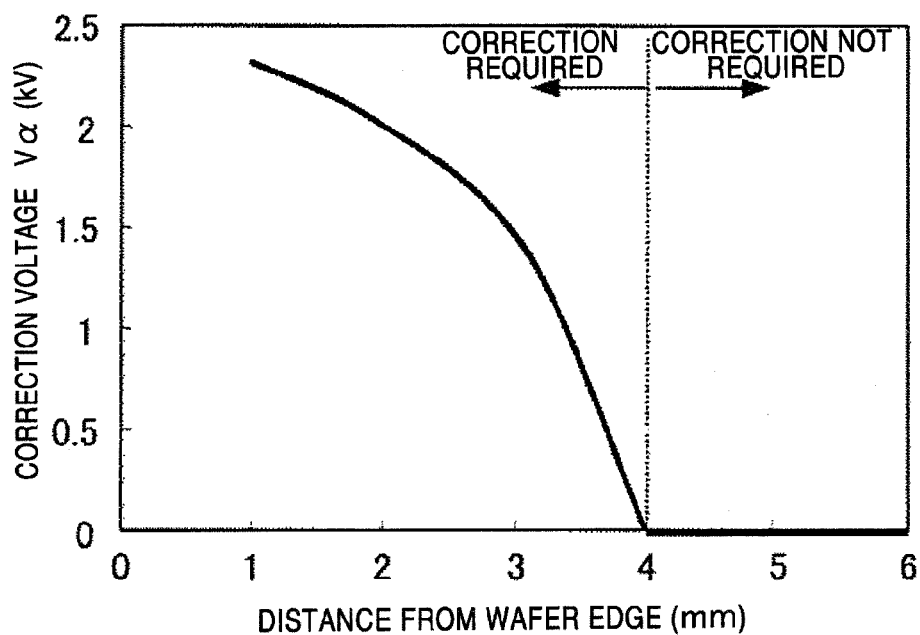
FIG. 9 A graph showing a relation between a distance from the outer periphery of the wafer and a correction voltage.

Referring to a flow chart of FIG. 7, a sequence of steps performed during the measuring operation using the dimension measuring SEM will be explained. FIG. 8 shows an example relationship, determined from simulation, between the deflection of the primary electron beam and the distance from the wafer edge. FIG. 9 shows an example of a simulated relationship between the distance from the wafer edge and the correction voltage.

The amount of the beam deflection (FIG. 8) and the value of the correction voltage (FIG. 9) change depending on the evaluation condition (recipe) such as the primary electron beam and the reference voltage. So, for all evaluation conditions under which the dimension measuring SEM is likely to be used, the applied voltages as related to the distances from the wafer edge are determined beforehand. The determined relationships between the distance and the applied voltage are stored in a correction table of the information processing/device control unit 1300.

First, the wafer 1201 loaded into the dimension measuring SEM is placed on the electrostatic chuck 1203 on the XY stage 1202 by a transfer mechanism not shown (6001). Then, the electrostatic chuck is impressed with voltages to hold the wafer 1201 by attraction (6002). At this time, the applied voltages to the electrostatic chuck are predetermined voltages ±V (V) for holding the wafer. The stage controller 1301 acquires from the information processing/device control unit 1300 a position coordinate on the wafer of a pattern to be evaluated (6003). The stage controller 1301 controls and positions the XY stage 1202 according to the acquired position coordinate so that the coordinate corresponding to the evaluation object position comes directly below the trajectory 2001 of the primary electron beam (6004).

The information processing/device control unit 1300 acquires the conditions of recipe (e.g., acceleration voltage, superimposing voltage, probe current, magnification, etc.) (6101) and obtains an optimum correction table for the recipe (6102).

Next, the information processing/device control unit 1300, based on the position of the evaluation object, calculates the distance from the wafer edge to the evaluation position (6103). The information processing/device control unit 1300, based on the calculated distance and the correction table, checks if the deflection of the primary electron beam needs to be corrected (6104). If it is decided that there is no need for correction, the information processing/device control unit 1300 executes the evaluation at the evaluation object position (6005). Then, the information processing/device control unit 1300 checks if the next measurement is required not (6006). If it is found that there is a next object to be evaluated, the information processing/device control unit 1300 acquires a coordinate of the next evaluation object position (6003). If the next object to be measured is not found, the information/device control unit 1300 turns off (opens) the voltage to the electrostatic chuck (6007) and instructs the discharging of the wafer (6008).

If, on the other hand, the step (6104) decides that the deflection of the primary electron beam needs to be corrected, the information processing/device control unit 1300, based on the distance of the evaluation object position from the wafer edge, accesses the correction table to get a correction voltage (addition voltage) (Vα) to be applied to the electrostatic chuck (6105). After this, the information processing/device control unit 1300 corrects the voltage applied to the electrostatic chuck according to the acquired correction voltage (6106). For example, ±V is changed to ±(V+Vα). Next the information processing/device control unit 1300 executes the evaluation on the evaluation object position. Then, the information processing/device control unit 1300 checks whether the next measurement is necessary (6006). If there is a next evaluation object, the information processing/device control unit 1300 acquires a coordinate of the next evaluation object position (6003). If, on the other hand, the next object to be measured is not found, the information processing/device control unit 1300 turns off (opens) the voltage applied to the electrostatic chuck (6007) and instructs the discharging of the wafer (6008).

(1-5) Summary

As described above, the use of the electrostatic chuck that satisfies the aforementioned conditions can effectively minimize the positional deviation of the charged electron beam caused by deflection even when the evaluation object position is near the wafer edge.

(2) Embodiment 2

Next, a second embodiment will be explained by referring to FIG. 10, FIG. 11 and FIG. 12. This embodiment concerns a dimension measuring SEM that can evaluate two kinds of wafers of different outer diameters in areas up to the wafer edge by using an electron beam without replacing the components of the dimension measuring SEM. The two kinds of wafers with different outer diameters used in this embodiment are silicon wafers, one 300 mm in diameter and another 450 mm in diameter.

(2-1) Construction of Electrostatic Chuck

Figure 10:
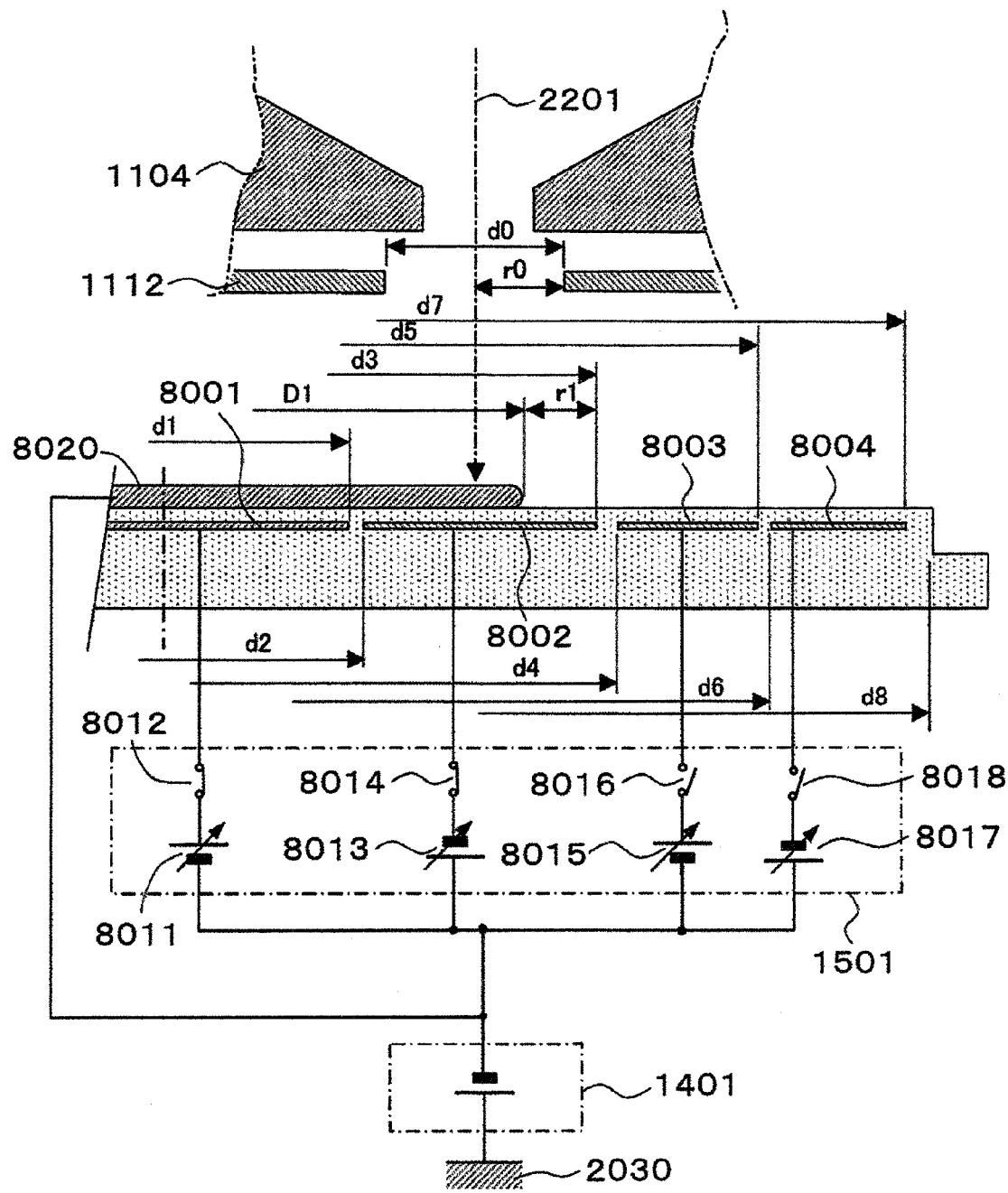
FIG. 10 A cross-sectional view showing how a wafer is placed in a second embodiment.

FIG. 10 shows a positional relation between the wafer edge and the electrostatic chuck when the wafer 8020, 300 mm in diameter, is evaluated. FIG. 11 is shows a positional relation between the wafer edge and the electrostatic chuck when the wafer 8021, 450 mm in diameter, is evaluated. These figures show positional relations among the wafer, the electrostatic chuck, the electrode plates of the electrostatic chuck, the objective lens and the control electrode. FIG. 12 is a plan view of the electrostatic chuck of FIG. 10 and FIG. 11 as seen from above.

In this embodiment, the electrostatic chuck 1203 has four electrode plates. These four electrodes plates are arranged concentrically. In the following, these four electrode plates are referred to, in order from inside to outside, as an inner electrode plate 8001, an inner intermediate electrode plate 8002, an outer intermediate electrode plate 8003 and an outer electrode plate 8004. Only the inner electrode plate 8001 is circular-shaped, with the remaining three ring-shaped. These electrode plates are connected to DC power supplies through switches. For example, the inner electrode plate 8001 is connected to a DC power supply 8011 through a switch 8012; the inner intermediate electrode plate 8002 is connected to a DC power supply 8013 through a switch 8014; the outer intermediate electrode plate 8003 is connected to a DC power supply 8015 through a switch 8016; and the outer electrode plate 8004 is connected to a DC power supply 8017 through a switch 8018.

In this embodiment, too, as in Embodiment 1, the supply voltages to the electrostatic chuck are set by taking the superimposing voltage (−V0) from the superimposing voltage power supply 1401 as a reference voltage. The inner electrode plate 8001 and the outer intermediate electrode plate 8003 may be impressed with a positive voltage (+V) and the inner intermediate electrode 8002 and the outer electrode plate 8004 with a negative voltage (−V). The voltages supplied from the DC power supplies 8011, 8013, 8015, 8017 can be varied by control signals from the information processing/device control unit 1305.

In this embodiment, the sizes of, and the positional relation among, the four electrode plates 8001, 8002, 8003, 8004 forming the electrostatic chuck 1203, two kinds of wafers 8020 (300 mm in diameter) and 8021 (450 mm in diameter) and the control electrode 1112 are defined as follows.

First, by referring to FIG. 10, the condition that needs to be established between the inner electrode plate 8001 and the inner intermediate electrode plate 8002 will be explained. The outer diameter d3 of the inner intermediate electrode plate 8002 is set to extend outwardly from the outer diameter D1 of the small-diameter wafer 8020 (300 mm in diameter) by the overreaching dimension r1. The outer diameter d3 of the inner intermediate electrode plate 8002 is determined so that a ratio, R1 (=r1/r0), of the overreaching dimension r1 (=(d3−D1)/2) to the radius r0 (=d0/2) of the hole (diameter=d0) at the center of the control electrode 1112 will be 0.7 or greater (≥0.7). For example, the ratio R1 may be 0.75, 0.80, 0.85, 0.90, 0.95, 1.00, 1.05, . . . .

Further, the dimensions of the inner electrode plate 8001 and the inner intermediate electrode plate 8002 are so set that an area of the inner electrode plate 8001 (circular area with diameter d1) is equal to a ring-shaped area of the inner intermediate electrode plate 8002 defined by the inner diameter d2 of the inner intermediate electrode plate and the outer diameter D1 of the wafer 8020. That is, these dimensions are determined to satisfy the following equation.

$$\pi \times (d1/2)^2 = \pi \times \{(D1/2)^2 - (d2/2)^2\}$$

Since D1=300 mm, the diameter d1 and the inner diameter d2 are determined to satisfy the condition $(d1/2)^2 = \{150^2 - (d2/2)^2\}$. This condition is required, as in Embodiment 1, to make practically equal the areas through which the inner electrode plate 8001 and the inner intermediate electrode plate 8002 apply their attraction forces to the wafer. This condition is also essential in controlling the potential applied to the wafer 8020 at an intermediate voltage (i.e., the reference voltage (−V0)) when the inner electrode plate 8001 is impressed with the positive voltage (+V) and the inner intermediate electrode plate 8002 with the negative voltage (−V).

Figure 11:
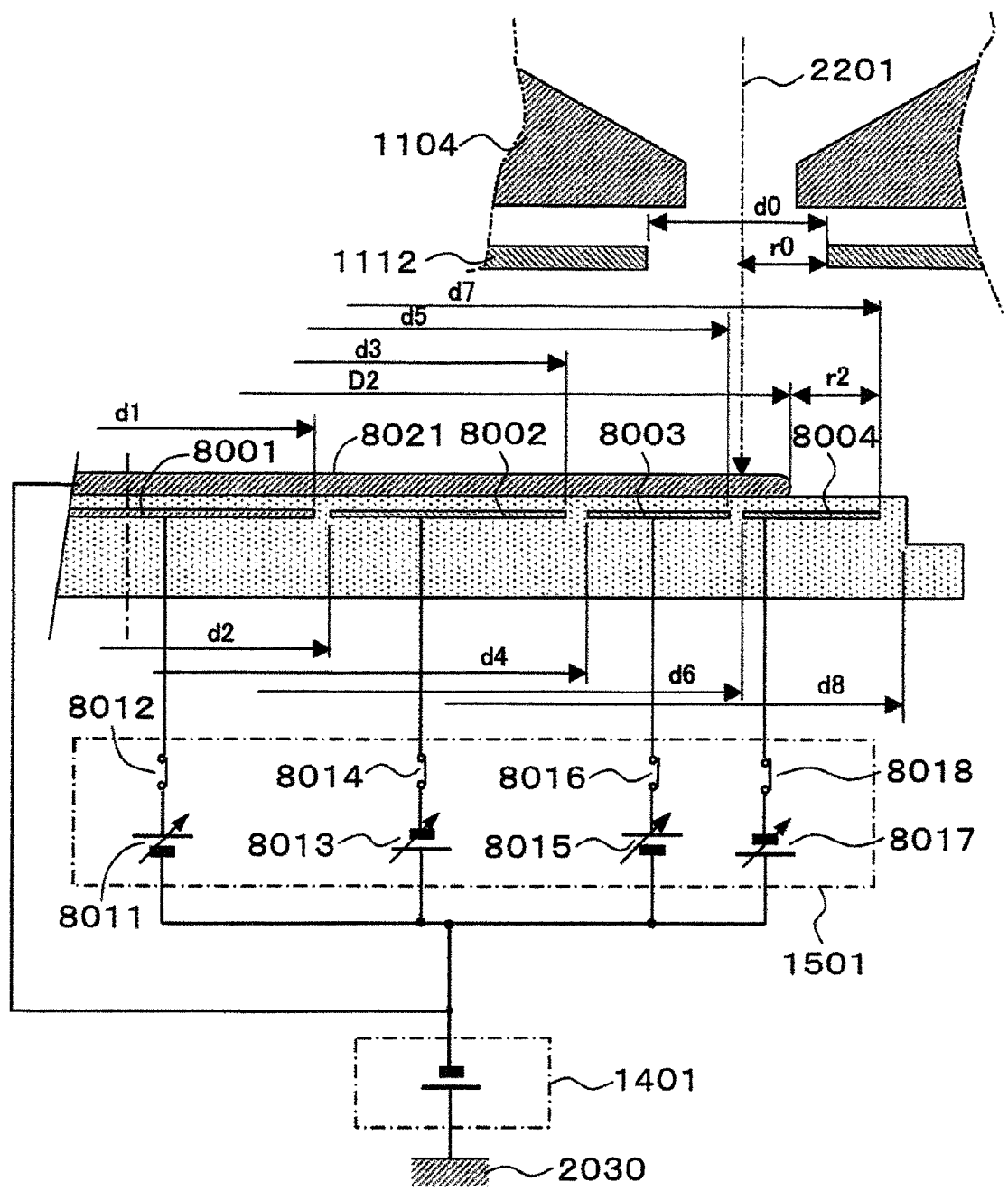
FIG. 11 A cross-sectional view showing an electrode and an applied voltage in the second embodiment.
Figure 12:
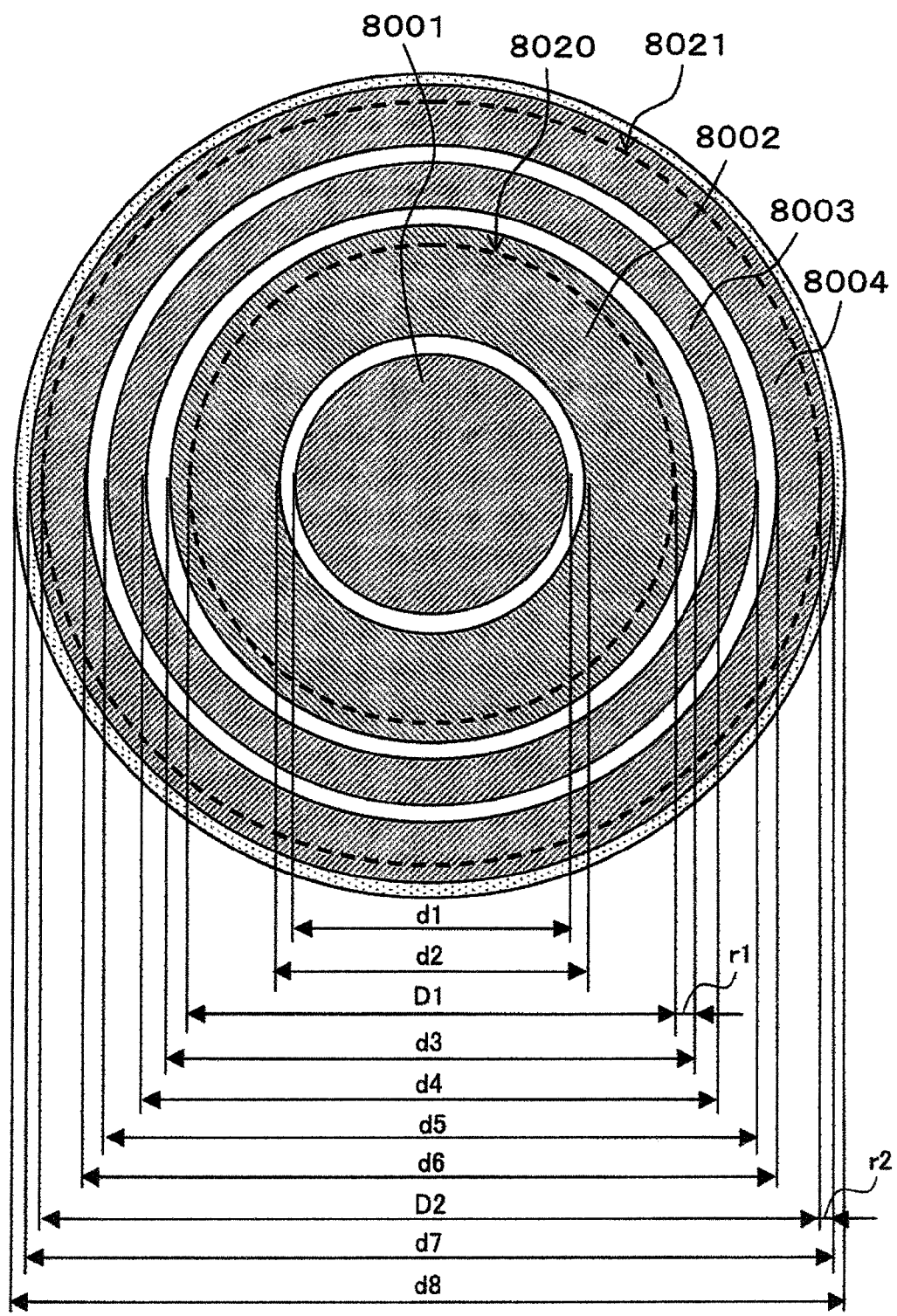
FIG. 12 A plan view showing a positional relation between an electrode plate structure used in the second embodiment and the wafer.

Referring to FIG. 11, the condition that needs to be established between the outer electrode plate 8004 and the outer intermediate electrode plate 8003 will be explained. The outer diameter d7 of the outer electrode plate 8004 is set to extend outwardly from the outer diameter D2 of the large-diameter wafer 8021 (450 mm in diameter) by the overreaching dimension r2. The outer diameter d7 of the outer electrode plate 8004 is determined so that a ratio, R2 (=r2/r0), of the overreaching dimension r2 (=(d7−D2)/2) to the radius r0 (=d0/2) of the hole (diameter=d0) at the center of the control electrode 1112 will be 0.7 or greater (≥0.7). For example, the ratio R2 may be 0.75, 0.80, 0.85, 0.90, 0.95, 1.00, 1.05, . . . .

Further, in this embodiment the dimensions of these electrode plates are determined so that the sum of the area of the inner electrode plate 8001 (circular area with diameter d1) and the area of the outer intermediate electrode plate 8003 (ring-shaped area between its inner diameter d4 and outer diameter d5) is equal to the sum of the ring-shaped area of the inner intermediate electrode plate 8002 (between its inner diameter d2 and outer diameter d3) and a ring-shaped area of the outer electrode plate 8004 between the inner diameter d6 of the outer electrode plate and the outer diameter D2 of the wafer 8021. That is, the dimensions are determined to meet the following equation.

$$\pi \times (d1/2)^2 + \pi \times \{(d5/2)^2 - (d4/2)^2\} = \pi \times \{(d3/2)^2 - (d2/2)^2\} + \pi \times \{(D2/2)^2 - (d6/2)^2\}$$

Since D2=450 mm, the remaining diameters d3, d4, d5 and d6 are determined to satisfy the condition: $(d1/2)^2 + \{(d5/2)^2 - (d4/2)^2\} = \{(d3/2)^2 - (d2/2)^2\} + \{225^2 - (d6/2)^2\}$. This condition is essential in making uniform the attraction force acting on the wafer and in controlling the potential applied to the wafer 8021 at the intermediate potential (i.e., reference voltage (−V0)).

(2-2) Sequence of Steps

Referring to a flow chart of FIG. 13, a sequence of steps performed on the dimension measuring SEM will be explained. Parts shown in FIG. 13 that are identical to those of FIG. 7 are assigned like reference numerals. In this embodiment, one of the two kinds of wafer is evaluated. So, prior to acquiring the electro-optical conditions, an operation (6201)

of acquiring wafer information (as to whether the wafer to be evaluated is a small-diameter wafer 8020 or a large-diameter wafer 8021) and an operation (6202) of determining the driving condition of the electrostatic chuck are performed. According to the result of the operation (6202), the open-close control of the switches 8012, 8014, 8016, 8018 and the values of voltages produced by the DC power supplies 8011, 8013, 8015, 8017 are variable-controlled.

In this embodiment, too, all evaluation conditions under which the dimension measuring SEM is likely to be used are determined in advance as conditions of voltage application according to the distance from the wafer edge. The predetermined relations between the distance and the applied voltage are stored in a correction table in the information processing/device control unit 1300.

First, the operation performed when the wafer 8020, 300 mm across, is evaluated (FIG. 10) will be explained. The wafer 8020 carried into the dimension measuring SEM is put on the electrostatic chuck 1203 on the XY stage 1202 by a transfer mechanism not shown (6001). At this time, the electrostatic chuck 1203 holds the wafer 8020 by attraction using the inner electrode plate 8001 and the inner intermediate electrode plate 8002. The inner electrode plate 8001 is impressed with a positive voltage (+V) and the inner intermediate electrode plate 8002 with a negative voltage (−V).

As described earlier, the outer diameter d3 of the inner intermediate electrode plate 8002 in this embodiment is larger than the outer diameter D1 of the wafer 8020, extending outwardly from the outer edge of the wafer 8020 by the overreaching dimension r1 (r1≥0.7×r0). So, over the portion of the inner intermediate electrode plate 8002 lying outside the edge of the wafer 8020 there is produced a negative electric field. This negative electric field, as in the case of Embodiment 1, can push up the equipotential planes that would otherwise sag at around the wafer periphery.

That is, the applied voltages used to operate the electrostatic chuck can minimize the deflection of the primary electron beam even when the evaluation object position is close to the wafer edge. Further, in this embodiment since the area of the inner electrode plate 8001 impressed with the positive voltage (+V) is equal to a ring-shaped area of the inner intermediate electrode plate 8002 impressed with the negative voltage (−V) which is enclosed between the inner diameter d2 of the inner intermediate electrode plate and the outer diameter D1 of the wafer 8020 (i.e., bipolar areas through which attractive forces act on the wafer are effectively equal), the potential of the wafer 8020 can be held at the reference voltage (−V0), an intermediate potential between the voltages applied to these electrode plates.

Next, the operation performed when the wafer 8021, 450 mm across, is evaluated (FIG. 11) will be explained. The wafer 8021 carried into the dimension measuring SEM is placed on the electrostatic chuck 1203 on the XY stage 1202 by a transfer mechanism not shown (6001). At this time, the electrostatic chuck 1203 holds the wafer 8021 by attraction using the four electrode plates—the inner electrode plate 8001, the inner intermediate electrode plate 8002, the outer intermediate electrode plate 8003 and the outer electrode plate 8004. At this time, the inner electrode plate 8001 is impressed with the positive voltage (+V), the inner intermediate electrode plate 8002 with the negative voltage (−V), the outer intermediate electrode plate 8003 (+V) and the outer electrode plate 8004 (−V).

As described above, the outer diameter d7 of the outer electrode plate 8004 in this embodiment is greater than the outer diameter D2 of the wafer 8021, extending outwardly from the outer edge of the wafer 8021 by the overreaching dimension r2 (r2≥0.7×r0). So, a negative electric field occurs over the portion of the outer electrode plate 8004 lying outside the edge of the wafer 8021. This negative electric field, as in Embodiment 1, can push up the equipotential planes that would otherwise sag at around the wafer periphery. That is, the applied voltages that operate the electrostatic chuck can minimize the deflection of the primary electron beam even when the evaluation object position is close to the wafer edge.

Further, in this embodiment, the sum of the area of the inner electrode plate 8001 (circular area with diameter d1) and the area of the outer intermediate electrode plate 8003 (ring-shaped area between its inner diameter d4 and outer diameter d5), both applied the positive voltage (+V), is equal to the sum of the area of the inner intermediate electrode plate 8002 (ring-shaped area between its inner diameter d2 and outer diameter d3) and the ring-shaped area of the outer electrode plate 8004 enclosed between the inner diameter d6 of the outer electrode plate 8004 and the outer diameter D2 of the wafer 8021, both electrodes applied the negative voltage (−V), (i.e., the bipolar areas through which attractive forces act on the wafer are effectively equal). With this arrangement, the potential of the wafer 8021 can be held at the reference voltage (−V0), an intermediate potential between the voltages applied to these electrode plates.

(2-3) Summary

As explained in Embodiment 1, the effectiveness of pushing up the sagging equipotential planes becomes large as the electric field over the overreaching portion of the electrode increases, i.e., as the voltage applied to the electrostatic chuck increases. Since the deflection of the primary electron beam increases as it approaches the outer edge of the wafer, the control of the voltages applied to the electrostatic chuck according to the distance of the evaluation object position from the wafer edge can more effectively prevent the deflection of the primary electron beam.

When the evaluation on wafer patterns proceeds to another wafer of a different outer diameter, the use of the device construction and the operation procedure as described in this embodiment allows the wafer pattern evaluation to be executed without changing the components of the dimension measuring SEM. As for the patterns near the wafer edge, the deflection of the primary electron beam can be effectively prevented to perform precise evaluation.

(3) Embodiment 3

Next, a third embodiment will be explained by referring to FIG. 14, FIG. 15 and FIG. 16. A dimension measuring SEM taken up in this embodiment also allows two kinds of wafers of different diameters to be evaluated with an electron beam up to their outer circumferential edge. In this embodiment, too, the two kinds of wafers of different diameters are silicon wafers 300 mm and 450 mm in diameter. What differs from Embodiment 2 is that the electrostatic chuck 1203 is constructed of three electrode plates.

(3-1) Construction of Electrostatic Chuck

Figure 14:
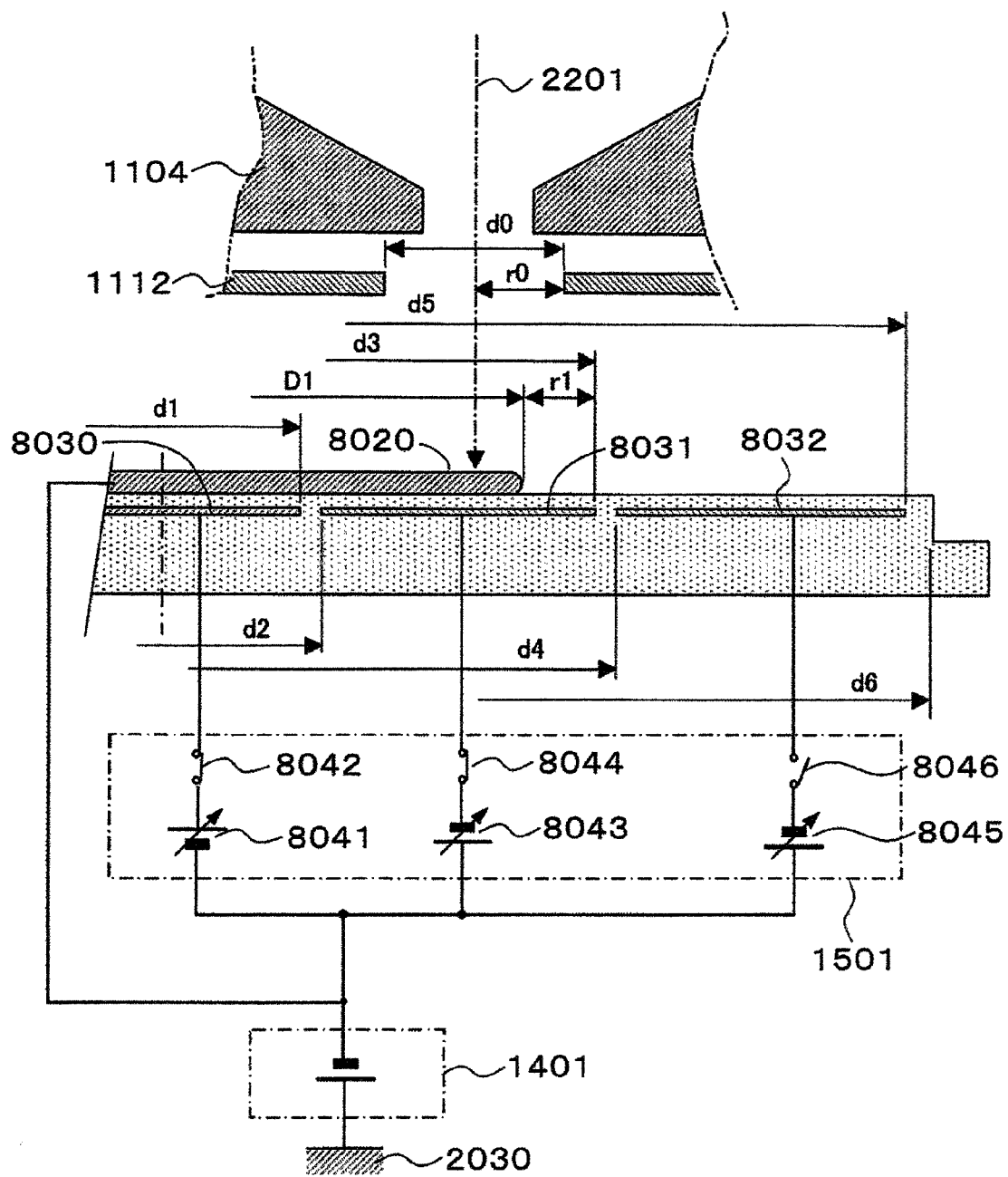
FIG. 14 A cross-sectional view showing a relation between each electrode and an applied voltage in a third embodiment.

FIG. 14 shows a positional relation between the outer circumferential edge of a wafer 8020, 300 mm across, and the electrostatic chuck during the wafer evaluation. FIG. 15 shows a positional relation between the outer circumferential edge of a wafer 8021, 450 mm across, and the electrostatic chuck during the wafer evaluation. These figures show a positional relation among the wafer, the electrostatic chuck, the electrodes of the electrostatic chuck, the objective lens and the control electrode. FIG. 16 is a plan view of the electrostatic chuck of FIG. 14 and FIG. 15 as seen from above.

In this embodiment, the electrostatic chuck 1203 has three electrode plates arranged concentrically. These three electrode plates are referred to, in order from inside to outside, as an inner electrode plate 8030, an intermediate electrode plate 8031 and an outer electrode plate 8032. Only the inner electrode plate 8030 is circular-shaped, with the other two ring-shaped. These electrode plates are connected to DC power supplies through switches. For example, the inner electrode plate 8030 is connected to a DC power supply 8041 through a switch 8042; the intermediate electrode plate 8031 is connected to a DC power supply 8043 through a switch 8044; and the outer electrode plate 8032 is connected to a DC power supply 8045 through a switch 8046.

In this embodiment, too, as in the two preceding embodiments, the supply voltages to the electrostatic chuck are set by taking the superimposing voltage (−V0) from the superimposing voltage power supply 1401 as a reference voltage. The DC power supply 8045 produces a negative voltage (−V) and the other two DC power supplies 8041, 8043 each can produce both a positive voltage (+V) and a negative voltage (−V). The voltages supplied from the DC power supplies 8041, 8043, 8045 can be varied by control signals from the information processing/device control unit 1305.

In this embodiment, the sizes of, and the positional relation among, the three electrode plates 8030, 8031, 8032 making up the electrostatic chuck 1203, the two kinds of wafers 8020 (300 mm across) and 8021 (450 mm across) and the control electrode 1112 are defined as follows.

First, by referring to FIG. 14, the condition that needs to be established between the inner electrode plate 8030 and the intermediate electrode plate 8031 will be explained. The outer diameter d3 of the intermediate electrode plate 8031 is set to extend outwardly from the outer diameter D1 of the small-diameter wafer 8020 (300 mm in diameter) by the overreaching dimension r1. The outer diameter d3 of the intermediate electrode plate 8030 is so determined that a ratio, R1 (=r1/r0), of the overreaching dimension r1 (=(d3−D1)/2) to the radius r0 (=d0/2) of the hole (diameter=d0) at the center of the control electrode 1112 will be 0.7 or greater (≥0.7). The ratio R1 may for example be 0.75, 0.80, 0.85, 0.90, 0.95, 1.00, 1.05, . . . .

Further, the dimensions of the inner electrode plate 8030 and the intermediate electrode plate 8031 are so set that an area of the inner electrode plate 8030 (circular area with diameter d1) is equal to a ring-shaped area of the intermediate electrode plate 8031 enclosed between the inner diameter d2 of the intermediate electrode plate and the outer diameter D1 of the wafer 8020. That is, these dimensions are determined to satisfy the following equation.

$$\pi \times (d1/2)^2 = \pi \times \{(D1/2)^2 - (d2/2)^2\}$$

Since D1=300 mm, the diameter d1 and the inner diameter d2 are determined to meet the condition $(d1/2)^2 = \{150^2 - (d2/2)^2\}$. This condition is required, as in the two preceding embodiments, to make practically equal the areas through which the inner electrode plate 8030 and the intermediate electrode plate 8031 apply their attraction forces to the wafer. This condition is also essential in controlling the potential applied to the wafer 8020 at an intermediate potential (i.e., the reference voltage (−V0) when the inner electrode plate 8030 is impressed with the positive voltage (+V) and the intermediate electrode plate 8031 with the negative voltage (−V).

Figure 15:
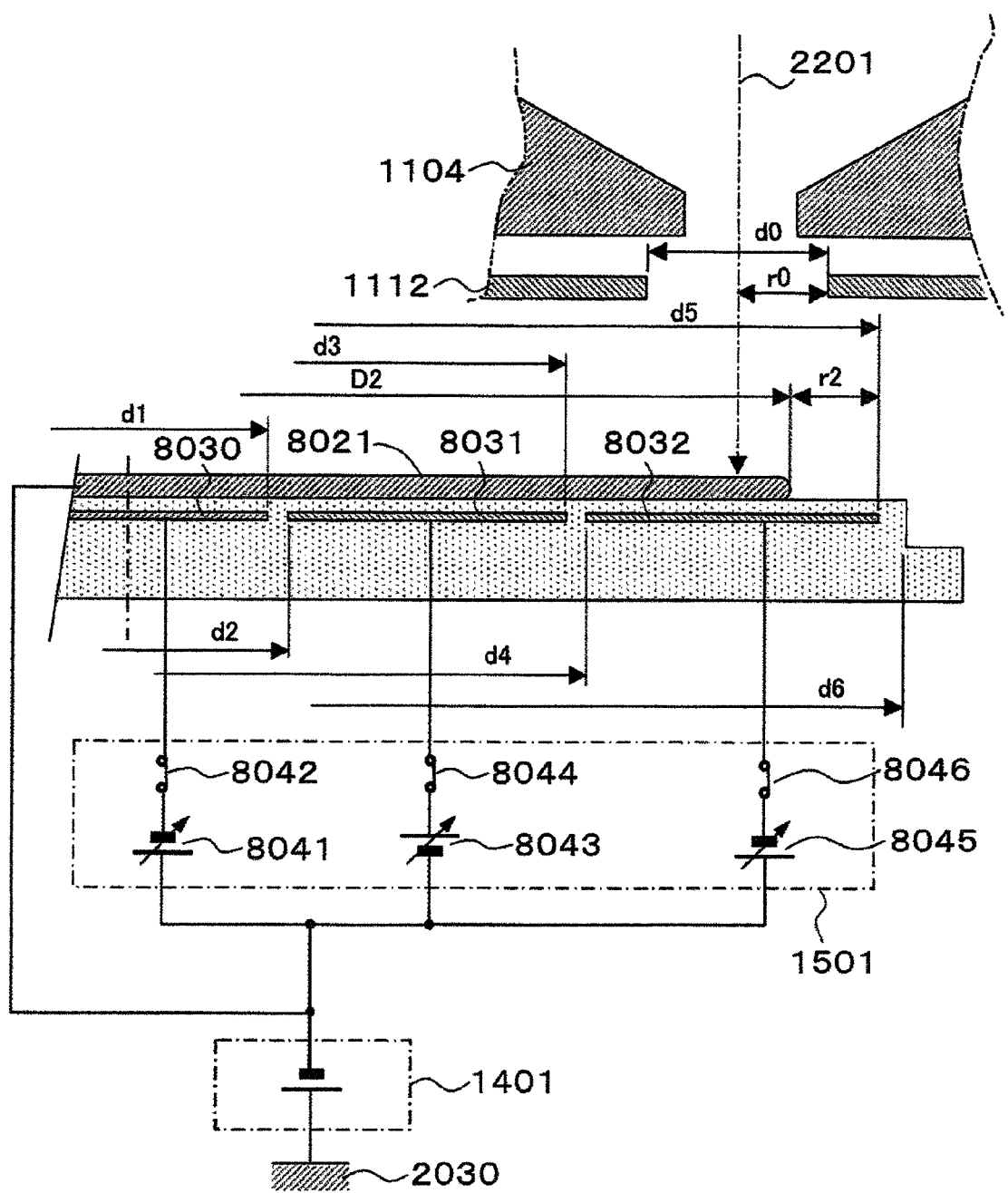
FIG. 15 Another cross-sectional view showing a relation between each electrode and an applied voltage in the third embodiment.
Figure 16:
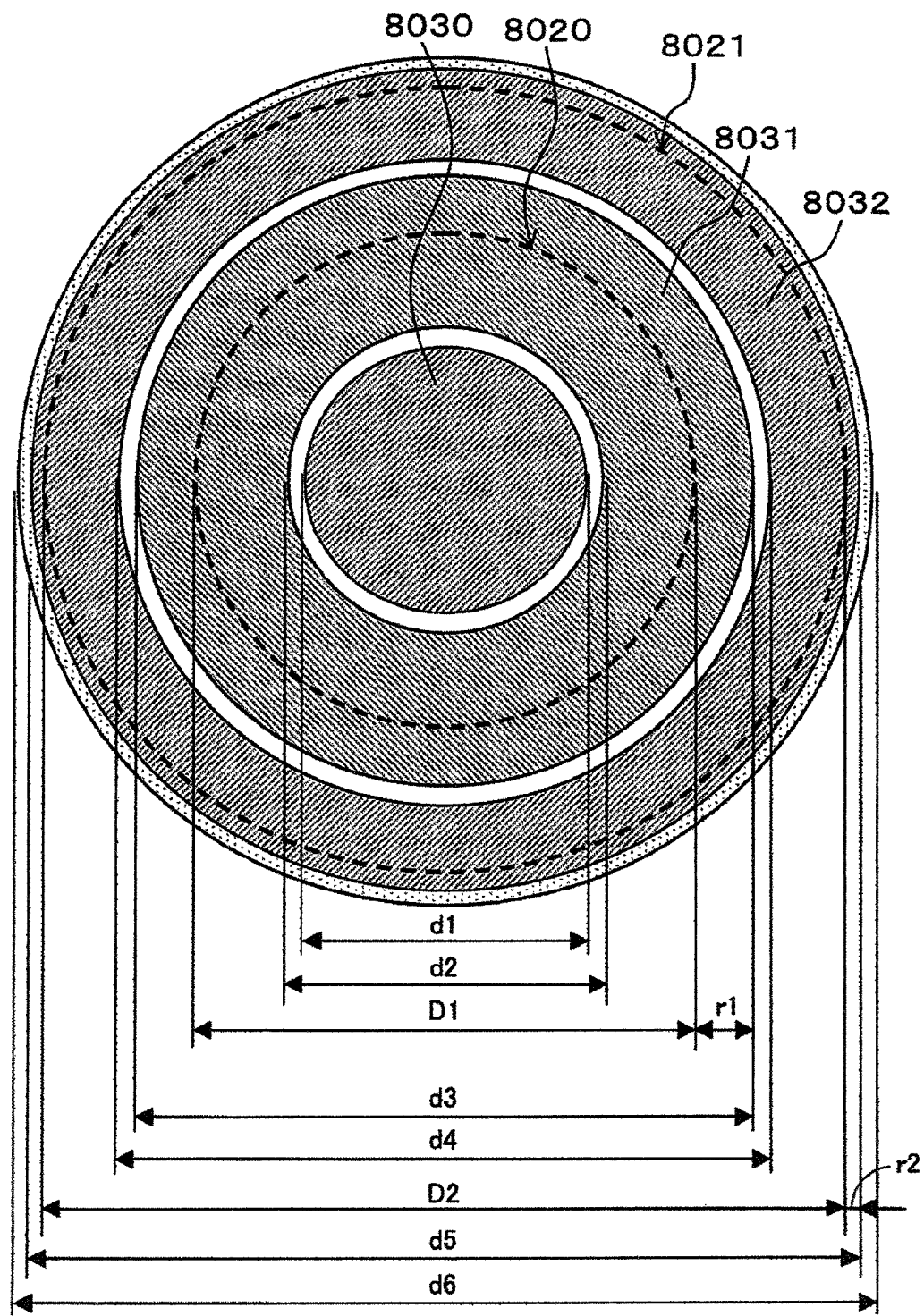
FIG. 16 A plan view showing a positional relation between an electrode plate structure used in the third embodiment and the wafer.

Referring to FIG. 15, the condition that needs to be established between the outer electrode plate 8032 and the intermediate electrode plate 8031 will be explained. The outer diameter d5 of the outer electrode plate 8032 is set to extend outwardly from the outer diameter D2 of the large-diameter wafer 8021 (450 mm in diameter) by the overreaching dimension r2. The outer dimension d5 of the outer electrode plate 8032 is determined so that a ratio, R2 (=r2/r0), of the overreaching dimension r2 (=(d5−D2)/2) to the radius r0 (=d0/2) of the hole (diameter=d0) at the center of the control electrode 1112 will be 0.7 or greater (≥0.7). The ratio R2 may for example be 0.75, 0.80, 0.85, 0.90, 0.95, 1.00, 1.05, . . . .

Further, in this embodiment the dimensions of these electrode plates are determined so that the sum of the area of the inner electrode plate 8030 (circular area with diameter d1) and the ring-shaped area of the outer electrode plate 8032 defined by the inner diameter d4 of the outer electrode plate and the outer Diameter D2 of the wafer 8021 is equal to the area of the intermediate electrode plate 8031 (ring-shaped area between its inner diameter d2 and outer diameter d3). That is, the dimensions are determined to meet the following equation.

$$\pi \times (d1/2)^2 + \pi \times \{(D2/2)^2 - (d4/2)^2\} = \pi \times \{(d3/2)^2 - (d2/2)^2\}$$

Since D2=450 mm, the other diameters d3, d4 are determined to satisfy the condition: $(d1/2)^2 + 225^2 - (d4/2)^2 = \{(d3/2)^2 - (d2/2)^2\}$. This condition is essential in making uniform the attraction force acting on the wafer and in controlling the potential applied to the wafer 8021 at the intermediate potential (i.e., reference voltage (−V0)).

(3-2) Sequence of Steps

Figure 13:
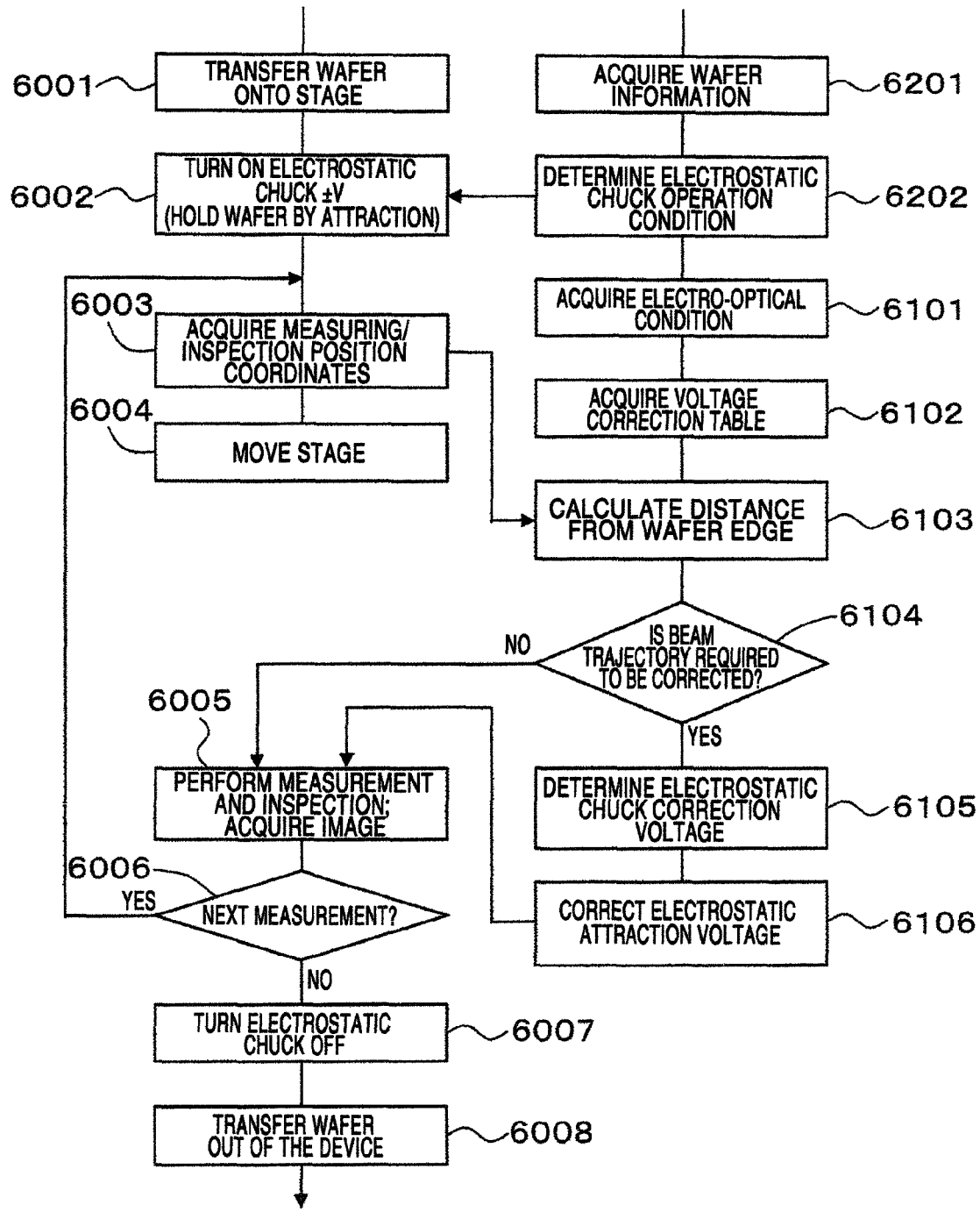
FIG. 13 A flow diagram showing a sequence of steps in the second embodiment.

The sequence of steps for measurement performed in the dimension measuring SEM of this embodiment is similar to that of Embodiment 2 (FIG. 13). Only those steps unique to this embodiment will be explained as follows.

First, a sequence of steps performed in measuring the wafer 8020, 300 mm across, will be explained (FIG. 14). The wafer 8020 carried into the dimension measuring SEM is put on the electrostatic chuck 1203 on the XY stage 1202 by a transfer mechanism not shown (6001). Then, the electrostatic chuck 1203 holds the wafer 8020 by attraction using the inner electrode plate 8030 and the intermediate electrode plate 8031. At this time, the inner electrode plate 8030 is impressed with a positive voltage (+V) and the intermediate electrode plate 8031 with a negative voltage (−V).

As described above, the outer diameter d3 of the intermediate electrode plate 8031 in this embodiment is larger than the outer diameter D1 of the wafer 8020 and extends outwardly from the outer edge of the wafer 8020 by the overreaching dimension r1 (r1≥0.7×r0). So, over the portion of the intermediate electrode plate 8031 lying outside the circumferential edge of the wafer 8020 there is produced a negative electric field. This negative electric field, as in the two preceding embodiments, can push up the equipotential planes that would otherwise sag at around the wafer periphery.

That is, the applied voltages used to operate the electrostatic chuck can minimize the deflection of the primary electron beam even when the evaluation object position is close to the wafer edge. Further, in this embodiment, since the area of the inner electrode plate 8030 impressed with the positive voltage (+V) is equal to the ring-shaped area of the intermediate electrode plate 8031 impressed with the negative voltage (−V) which is enclosed between the inner diameter d2 of the intermediate electrode plate and the outer diameter D1 of the wafer 8020 (i.e., bipolar areas through which attractive forces act on the wafer are effectively equal), the potential of the wafer 8020 can be held at the reference voltage (−V0), an intermediate potential between the voltages applied to these electrode plates.

Next, the operation performed when the wafer 8021, 450 mm across, is evaluated (FIG. 15) will be explained. The wafer 8021 carried into the dimension measuring SEM is placed on the electrostatic chuck 1203 on the XY stage 1202 by a transfer mechanism not shown (6001). At this time, the electrostatic chuck 1203 holds the wafer 8021 by attraction using the three electrode plates—the inner electrode plate 8030, the intermediate electrode plate 8031 and the outer electrode plate 8032.

At this time, the inner electrode plate 8030 and the outer electrode plate 8032 are impressed with the negative voltage (−V) and the intermediate electrode plate 8031 with the positive voltage (+V).

As described above, the outer diameter d5 of the outer electrode plate 8032 in this embodiment is greater than the outer diameter D2 of the wafer 8021, extending outwardly from the circumferential edge of the wafer 8021 by the overreaching dimension r2 (r2≥0.7×r0). So, over the portion of the outer electrode plate 8032 lying outside the edge of the wafer 8021 there is formed a negative electric field. This negative electric field, as in the two preceding embodiments, can push up the equipotential planes that would otherwise sag at around the wafer periphery. That is, the applied voltages used to operate the electrostatic chuck can minimize the deflection of the primary electron beam even when the evaluation object position is close to the wafer edge.

Further, in this embodiment, the area of the intermediate electrode plate 8031 impressed with the positive voltage (+V) (ring-shaped area between its inner diameter d2 and outer diameter d3) is equal to the sum of the area of the inner electrode plate 8030 (circular area with diameter d1) and the ring-shaped area of the outer electrode plate 8032 defined by the inner diameter d4 of the outer electrode plate and the outer diameter D2 of the wafer 8021, both electrodes applied the negative voltage (−V), (i.e., the bipolar areas through which attractive forces act on the wafer are effectively equal). With this arrangement, the potential of the wafer 8021 can be held at the reference voltage (−V0), an intermediate potential between the voltages applied to these electrode plates.

(3-3) Summary

In this embodiment, as described above, the same effect as the second embodiment can be realized with the electrostatic chuck made up of the three electrode plates and with the three DC power supplies. That is, compared with Embodiment 2, the third embodiment can simplify the construction of the electrostatic chuck and reduce the number of DC power supplies.

In this embodiment, however, the DC power supplies 8041, 8043 for the inner electrode plate 8030 and the intermediate electrode plate 8031 must be able to reverse their polarity between the evaluation of wafers 300 mm across (FIG. 14) and the evaluation of wafers 450 mm across (FIG. 15).

As described above, the effectiveness of pushing up the sagging equipotential planes increases as the strength of the electric field over the overreaching electrode increases, i.e., the voltage applied to the electrostatic chuck increases. Since the deflection of the primary electron beam becomes large as the beam approaches the circumferential edge of the wafer, the control of voltages applied to the electrostatic chuck according to the distance of the evaluation object position from the wafer edge can more effectively prevent the deflection of the primary electron beam.

When the wafer being evaluated is changed to a wafer of a different diameter, the use of the device construction and the operation procedure as described in this embodiment allows the wafer pattern evaluation to be executed without changing the components of the dimension measuring SEM. As for the patterns near the wafer edge, the deflection of the primary electron beam can be effectively prevented to perform precise evaluation.

While the foregoing description has been made on example embodiments, it is apparent to those skilled in the art that the present invention is not limited to these examples and that a variety of changes and modifications may be made without departing from the spirit of the invention and from the scope of the appended claims.

REFERENCE SIGNS LIST

1100: Electro-optical system
1200: Vacuum chamber
1300: Information processing/device control unit
1101: Electron gun
1102: Primary electron beam
1103: Condenser lens
1104: Objective lens
1105, 1106: Deflector
1107: Alignment coil
1108: Astigmatism correction coil
1109: Objective lens iris
1110: Secondary electron detector
1111: A/D converter
1112: Control electrode
1201: Wafer (semiconductor substrate specimen)
1202: XY stage
1203: Specimen holder (electrostatic chuck)
1301: Stage controller
1302: Deflection/focus control unit
1303: Acceleration voltage control unit
1304: Database
1305: Computer
1401: Superimposing voltage power supply
2001: Trajectory of primary electron beam
2010: Dielectric
2011, 3010, 3011, 8001, 8002, 8003, 8004, 8030, 8031, 8032: Electrode plates
2020: Equipotential planes
2030: Ground
8011, 8013, 8015, 8017, 8041, 8043, 8045: DC power supplies
8012, 8014, 8016, 8018, 8042, 8044, 8046: Switches
8020: Wafer (300 mm in diameter)
8021: Wafer (450 mm in diameter)

The invention claimed is:

1. A charged particle beam device comprising:
a unit which generates a deceleration electric field for a primary charged particle beam;
a specimen holding mechanism of electrostatic attraction type having a surface on which to hold a specimen to be evaluated, a circular first electrode plate and a ring-shaped second electrode plate, the two electrode plates being insulated from each other and arranged concentrically;
a unit which applies a predetermined voltage to a control electrode disposed between the specimen and an objective lens;
a unit which applies to the first electrode plate a voltage of a positive polarity with respect to a reference voltage and of an arbitrary magnitude, the reference voltage being used to generate the deceleration electric field; and
a unit which applies to the second electrode plate a voltage of a negative polarity with respect to the reference voltage and of an arbitrary magnitude;
wherein an outer diameter of the second electrode plate is larger than an outer diameter of the specimen; and
wherein a ring-shaped area of the second electrode plate enclosed by an inner diameter of the second electrode plate and the outer diameter of the specimen is substantially equal to an area of the first electrode plate.

2. A charged particle beam device according to claim 1, wherein a difference between the outer diameter of the second electrode plate and the outer diameter of the specimen is 70% or more of a hole formed in the control electrode through which to pass charged particles.

3. A charged particle beam device comprising:
a unit which generates a deceleration electric field for a primary charged particle beam;
a specimen holding mechanism of electrostatic attraction type having a surface on which to hold a specimen to be evaluated, a circular first electrode plate and ring-shaped second, third and fourth electrode plates, the ring-shaped second, third and fourth electrode plates being insulated from each other and from the first electrode plate and arranged concentrically, in that order from inside to outside, around the first electrode plate;
a unit which applies a predetermined voltage to a control electrode disposed between the specimen and an objective lens;
a unit which applies to the first electrode plate and the third electrode plate a voltage of a positive polarity with respect to a reference voltage and of an arbitrary magnitude, the reference voltage being used to generate the deceleration electric field; and
a unit which applies to the second electrode plate and the fourth electrode plate a voltage of a negative polarity with respect to the reference voltage and of an arbitrary magnitude;
wherein an outer diameter of the second electrode plate is larger than an outer diameter of a small-diameter specimen;
wherein a ring-shaped area of the second electrode plate enclosed by an inner diameter of the second electrode plate and the outer diameter of the small-diameter specimen is substantially equal to an area of the first electrode plate;
wherein an outer diameter of the fourth electrode plate is larger than an outer diameter of a large-diameter specimen; and
wherein a sum of a ring-shaped area of the fourth electrode plate enclosed by an inner diameter of the fourth electrode plate and the outer diameter of the large-diameter specimen and an area of the second electrode plate is substantially equal to a sum of the area of the first electrode plate and an area of the third electrode plate.

4. A charged particle beam device according to claim 3, wherein a difference between the outer diameter of the second electrode plate and the outer diameter of the small-diameter specimen and a difference between the outer diameter of the fourth electrode plate and the outer diameter of the large-diameter specimen are both 70% or more of a hole formed in the control electrode through which to pass charged particles.

5. A charged particle beam device comprising:
a unit which generates a deceleration electric field for a primary charged particle beam;
a specimen holding mechanism of electrostatic attraction type having a surface on which to hold a specimen to be evaluated, a circular first electrode plate and ring-shaped second and third electrode plates, the ring-shaped second and third electrode plates being insulated from each other and from the first electrode plate and arranged concentrically, in that order from inside to outside, around the first electrode plate;
a unit which applies a predetermined voltage to a control electrode disposed between the specimen and an objective lens;
a unit which applies to the first electrode plate a voltage of a positive or a negative polarity with respect to a reference voltage and of an arbitrary magnitude and, to the second electrode plate, a voltage of a polarity opposite to that of the voltage applied to the first electrode plate and of an arbitrary magnitude, the reference voltage being used to generate the deceleration electric field; and
a unit which applies to the third electrode plate a voltage of a negative polarity with respect to the reference voltage and of an arbitrary magnitude;
wherein an outer diameter of the second electrode plate is larger than an outer diameter of a small-diameter specimen;
wherein a ring-shaped area of the second electrode plate enclosed by an inner diameter of the second electrode plate and the outer diameter of the small-diameter specimen is substantially equal to an area of the first electrode plate;
wherein an outer diameter of the fourth electrode plate is larger than an outer diameter of a large-diameter specimen; and
wherein a sum of a ring-shaped area of the third electrode plate enclosed by an inner diameter of the third electrode plate and the outer diameter of the large-diameter specimen and the area of the first electrode plate is substantially equal to an area of the second electrode plate.

6. A charged particle beam device according to claim 5, wherein a difference between the outer diameter of the second electrode plate and the outer diameter of the small-diameter specimen and a difference between an outer diameter of the third electrode plate and the outer diameter of the large-diameter specimen are both 70% or more of a hole formed in the control electrode through which to pass charged particles.

7. A charged particle beam device according to claim 1, further comprising:
a table unit relates to each other, and stores, a condition of the charged particle beam to be thrown at an evaluation object position, a distance of the evaluation object position from an outer edge of the specimen and optimal voltages to be applied to the electrode plates;
a unit which calculates a distance of a current evaluation object position from the outer edge of the specimen; and
a unit which controls the voltages to be applied to the electrode plates according to the condition of the charged particle beam thrown at the current evaluation object position and the calculated distance.

8. A specimen evaluation method using a charged particle beam device, wherein the charged particle beam device comprises:
a unit which generates a deceleration electric field for a primary charged particle beam;
a specimen holding mechanism of electrostatic attraction type having a surface on which to hold a specimen to be evaluated; and
a unit which applies a predetermined voltage to a control electrode disposed between the specimen and an objective lens;
wherein the specimen holding mechanism has a circular first electrode plate and a ring-shaped second electrode plate, insulated from each other and arranged concentrically, the second electrode plate having an outer diameter larger than an outer diameter of the specimen; and
wherein, when a ring-shaped area of the second electrode plate enclosed between an inner diameter of the second electrode plate and the outer diameter of the specimen is substantially equal to an area of the first electrode plate, the specimen evaluation method executes an operation of applying to the first electrode plate a voltage of a positive polarity with respect to a reference voltage and of an arbitrary magnitude, the reference voltage being used to generate the deceleration electric field, and an operation of applying to the second electrode plate a voltage of a negative polarity with respect to the reference voltage and of an arbitrary magnitude.

9. A specimen evaluation method using a charged particle beam device, wherein the charged particle beam device comprises:
- a unit which generates a deceleration electric field for a primary charged particle beam;
- a specimen holding mechanism of electrostatic attraction type having a surface on which to hold a specimen to be evaluated; and
- a unit which applies a predetermined voltage to a control electrode disposed between the specimen and an objective lens;
- wherein the specimen holding mechanism has a circular first electrode plate and ring-shaped second, third and fourth electrode plates, the ring-shaped second, third and fourth electrode plates being insulated from each other and from the first electrode plate and arranged concentrically, in that order from inside to outside, around the first electrode plate;
- wherein an outer diameter of the second electrode plate is larger than an outer diameter of a small-diameter specimen;
- wherein a ring-shaped area of the second electrode plate enclosed by an inner diameter of the second electrode plate and the outer diameter of the small-diameter specimen is substantially equal to an area of the first electrode plate, and an outer diameter of the fourth electrode plate is larger than an outer diameter of a large-diameter specimen; and
- wherein, when a sum of a ring-shaped area of the fourth electrode plate enclosed between an inner diameter of the fourth electrode plate and the outer diameter of the large-diameter specimen is substantially equal to a sum of the area of the first electrode plate and an area of the third electrode plate, the specimen evaluation method executes an operation of applying to the first electrode plate and the third electrode plate a voltage of a positive polarity with respect to a reference voltage and of an arbitrary magnitude, the reference voltage being used to generate the deceleration electric field, and an operation of applying to the second electrode plate and the fourth electrode plate a voltage of a negative polarity with respect to the reference voltage and of an arbitrary magnitude.

10. A specimen evaluation method using a charged particle beam device, wherein the charged particle beam device comprises:
- a unit which generates a deceleration electric field for a primary charged particle beam;
- a specimen holding mechanism of electrostatic attraction type having a surface on which to hold a specimen to be evaluated; and
- a unit which applies a predetermined voltage to a control electrode disposed between the specimen and an objective lens;
- wherein the specimen holding mechanism has a circular first electrode plate and ring-shaped second and third electrode plates, the ring-shaped second and third electrode plates being insulated from each other and from the first electrode plate and arranged concentrically, in that order from inside to outside, around the first electrode plate;
- wherein an outer diameter of the second electrode plate is larger than an outer diameter of a small-diameter specimen;
- wherein a ring-shaped area of the second electrode plate enclosed by an inner diameter of the second electrode plate and the outer diameter of the small-diameter specimen is substantially equal to an area of the first electrode plate, and an outer diameter of the third electrode plate is larger than an outer diameter of a large-diameter specimen; and
- wherein, when a sum of a ring-shaped area of the third electrode plate enclosed between an inner diameter of the third electrode plate and the outer diameter of the large-diameter specimen and an area of the second electrode plate is substantially equal to an area of the second electrode plate, the specimen evaluation method executes an operation of applying to the first electrode plate a voltage of a positive or a negative polarity with respect to a reference voltage and of an arbitrary magnitude and, to the second electrode plate, a voltage of a polarity opposite to that of the voltage applied to the first electrode plate and of an arbitrary magnitude, the reference voltage being used to generate the deceleration electric field, and an operation of applying to the third electrode plate a voltage of a negative polarity with respect to the reference voltage and of an arbitrary magnitude.

11. A specimen evaluation method using a charged particle beam device according to claim 8, executing:
- an operation of calculating a distance of a current evaluation object position from an outer edge of the specimen; and
- an operation of referring to a table unit, which relates to each other, and store, a condition of the charged particle beam to be thrown at an evaluation object position, the distance of the evaluation object position from the outer edge of the specimen and optimal voltages to be applied to the electrode plates, and controlling the voltages to be applied to the electrode plates based on the condition of the charged particle beam thrown at the current evaluation object position and the calculated distance.

* * * * *